(12) United States Patent
Yamashita

(10) Patent No.: US 6,564,343 B1
(45) Date of Patent: May 13, 2003

(54) BIT INTERLEAVE CIRCUIT AND BIT DEINTERLEAVE CIRCUIT

(75) Inventor: Atsushi Yamashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/476,446

(22) Filed: Dec. 30, 1999

(30) Foreign Application Priority Data

Feb. 19, 1999 (JP) .......................................... 11-041563

(51) Int. Cl.⁷ ................................................ G06F 11/00
(52) U.S. Cl. ....................................................... 714/701
(58) Field of Search ................................ 714/702, 762, 714/787

(56) References Cited

U.S. PATENT DOCUMENTS

| | | | |
|---|---|---|---|
| 4,541,091 A | | 9/1985 | Nishida et al. |
| 5,051,998 A | * | 9/1991 | Murai et al. ................. 714/762 |
| 5,204,874 A | | 4/1993 | Falconer et al. |
| 5,802,079 A | | 9/1998 | Wang |
| 6,185,200 B1 | * | 2/2001 | Prasad ........................ 370/342 |

FOREIGN PATENT DOCUMENTS

| | | | | |
|---|---|---|---|---|
| DE | 1020996 A1 | * | 7/2000 | .......... H03M/13/27 |
| EP | 0 402 115 A2 | | 12/1990 | |
| EP | 0 507 557 A1 | | 10/1992 | |
| EP | 0 632 613 A1 | | 1/1995 | |
| EP | 0 696 108 A1 | | 2/1996 | |
| GB | 0954109 A2 | * | 11/1999 | .......... H03M/13/22 |
| JP | 60-144026 | | 7/1985 | |
| JP | 7-050698 | | 2/1995 | |
| JP | 8-097731 | | 4/1996 | |

OTHER PUBLICATIONS

Horvath et al., A novel high speed reconfigurable demapper symbol deinterleaver architecture for DVB–T, IEEE, pp. 382–385, 1999.*

* cited by examiner

*Primary Examiner*—Albert Decady
*Assistant Examiner*—Shelly A Chase
(74) *Attorney, Agent, or Firm*—Katten Muchin Zavis Rosenman

(57) ABSTRACT

A bit deinterleave circuit comprises: measurement unit for measuring the reception level of each bit in a received symbol completing a bit interleave process; a command-signal generating unit for outputting a command signal to indicate whether computation in error correction is to be inhibited or permitted for each symbol on the basis of the reception level of the symbol measured by the measurement unit and a threshold value; a first deinterleave unit for deinterleaving the received signal completing a bit interleave process; and second deinterleave unit for rearranging command signals to output the command signals according to a signal output by the first deinterleave unit.

6 Claims, 24 Drawing Sheets

FIG. 21

| Read address counter (horizontal direction) | 0 | | | 1 | | |
|---|---|---|---|---|---|---|
| Read address counter (vertical direction) | 0 | 1 | 0 | 1 | 0 | 1 |
| Output #0 | 0 | 1 | 8 | 9 | 0 | 1 |
| Output #1 | 1 | 0 | 9 | 8 | 2 | A |
| Output #2 | 4 | 5 | C | D | 3 | B |
| Output #3 | 5 | 4 | D | C | 6 | E |
| Selector | Select outputs #0,#2 | Select outputs #1,#3 | Select outputs #0,#2 | Select outputs #1,#3 | | |
| P/S input | 0 | 8 | 1 | 9 | 2 | A | 3 | B |
| | 4 | C | 5 | D | 6 | E | 7 | F |

BIT INTERLEAVE CIRCUIT AND BIT DEINTERLEAVE CIRCUIT

BACKGROUND OF THE INVENTION

1. Field of the Invention

In general, The present invention relates to a bit interleave circuit and a bit deinterleave circuit which are used in a mobile communication system or a mobile broadcasting system.

2. Description of the Related Art

In a system where information is communicated or broadcasted by using a radio wave to a movable body such as an automobile, there is a problem of deterioration in quality of communication due to attenuation of received power which is caused by shadowing or fading. Shadowing is a phenomenon in which an electric wave is blocked by a building or the like. On the other hand, fading is a phenomenon in which interference between multipath delayed waves occurs. In particular, when an FEC (Forward Error Correction) apparatus is used for improving the quality of communication, the ability to correct an error deteriorates in case a burst error is generated by shadowing or fading, raising a problem of a substantially deteriorating quality of communication.

In order to prevent the quality of communication from considerably deteriorating due to shadowing or fading, a bit interleave circuit and a bit deinterleave circuit are employed on the transmitter and receiver sides, respectively in many cases. To put in detail, a random-access memory with a 2-plane configuration is employed so as to allow a series of output codes generated by an error correction encoder to be transmitted by changing the order of the codes in accordance with a proper rule. On the receiver side, on the other hand, the received codes are rearranged in the reverse order to reproduce the original series of codes which is then supplied to an error correction decoder. In this way, burst errors generated along the radio transmission path can be randomized so that the deterioration of the ability to correct an error is reduced.

FIG. 22 is a diagram showing the configuration of the conventional bit interleave circuit and FIG. 23 is a diagram showing the configuration of the conventional bit deinterleave circuit. FIG. 24 is an explanatory diagram used for describing the operations of the bit interleave and bit deinterleave circuits shown in FIGS. 22 and 23 respectively for an interleave block of 4×4 bits.

(a) Bit Interleave Operation

As shown in FIG. 24, information coded by an FEC encoder 50 by adopting a convolution encoding technique or the like is converted into serial data by a P/S converter 52 before being fed to the bit interleave circuit 54 shown in FIG. 22. In the bit interleave circuit 54, a horizontal-direction counter 6 employed in a write-address counter 2 counts the number of clocks synchronized with an input signal repeatedly from 0 to 3, outputting the clock count to an address terminal of either a RAM 16#0 or a RAM 16#1 by way of a selector 14#0 or 14#1, respectively as a lower-order address.

On the other hand, a vertical-direction counter 4 also employed in the write-address counter 2 counts the number of clock periods repeatedly from 0 to 3, outputting the clock-period count to the address terminal of either the RAM 16#0 or the RAM 16#1 by way of the selector 14#0 or 14#1, respectively as an upper-order address. By a clock period, the counting period of the horizontal-direction counter 6 is meant. A RAM plane switching control signal controls the RAMs 16#0 and 16#1 so that their write-in and read-out operations are mutually exclusive. To be more specific, when a read operation is carried out on one of the RAMs 16#0 or 16#1, a write operation is carried out on the other.

A gate circuit 18#0 supplies a RAM write timing signal to a write enable terminal WE of the RAM 16#0 in accordance with the RAM plane switching control signal. By the same token, a gate circuit 18#1 supplies a RAM write timing signal to a write enable terminal WE of the RAM 16#1 in accordance with the RAM plane switching control signal. A gate circuit 20#0 receives a serial transmission signal (0 to F), outputting the signal to a terminal data #0 of the RAM 16#0 in accordance with the RAM plane switching control signal. By the same token, a gate circuit 20#1 receives a serial transmission signal (0 to F), outputting the signal to a terminal data #0 of the RAM 16#1 in accordance with the RAM plane switching control signal. It should be noted that the reference numerals 0 to F are hexadecimal numbers representing the contents of the encoded list.

When the RAM write timing signal supplied to the write enable terminal WE of the RAM 16#0 or 16#1 is active, the encoded list supplied to the terminal data #0 is written into a location in the RAM 16#0 or 16#1 indicated by the address signal supplied to the address terminal. As a result, the contents of the i-th encoded list are written into a location at the address i as shown in FIG. 24. A vertical-direction counter 12 employed in a read-address counter 8 repeatedly counts the number of clocks synchronized with an input signal from 0 to 3, outputting the clock count to the selector either 14#0 or 14#1, respectively as an upper-order address.

On the other hand, a horizontal-direction counter 10 also employed in the read-address counter 8 counts the number of clock periods repeatedly from 0 to 3, outputting the clock-period count to the address terminal of either the RAM 16#0 or the RAM 16#1 by way of the selector 14#0 or 14#1, respectively as a lower-order address. By a clock period, the counting period of the vertical-direction counter 12 is meant. Either of the RAMs 16#0 and the 16#1 outputs an encoded list from a location indicated by an address supplied to the address terminal thereof to a transmission system by way of a selector 22. In this way, the signal to be transmitted is interleaved in the order of 0, 4, 8, C, 1, 5, 9 and so on.

(b) Bit Deinterleave Operation

In the bit deinterleave circuit 56 shown in FIG. 23, a vertical-direction counter 34 employed in a write-address counter 30 counts the number of clocks synchronized with an input signal, repeatedly from 0 to 3, outputting the clock count to the address terminal of either a RAM 42#0 or a RAM 42#1 by way of a selector 40#0 or 40#1, respectively as an upper-order address. On the other hand, a horizontal-direction counter 32 also employed in the write-address counter 30 counts the number of clock periods repeatedly from 0 to 3, outputting the clock-period count to the address terminal of either the RAM 42#0 or the RAM 42#1 by way of the selector 40#0 or 40#1, respectively as a lower-order address. By a clock period, the counting period of the vertical-direction counter 34 is meant. Data supplied to the terminal data #0 is written into a location in the RAM 42#0 or 42#1 indicated by the address signal supplied to the address terminal. As a result, a signal i received in the order of 0, 4, 8, C, 1 and so on is written at an address i where i is the order number of the encoded list prior to the interleave process.

A horizontal-direction counter 39 employed in a read-address counter 36 repeatedly counts the number of clocks synchronized with an input signal from 0 to 3, outputting the clock count to the address terminal of either the RAM 42#0 or the RAM 42#1 by way of the selector 40#0 or 40#1, respectively as a lower-order address. On the other hand, a vertical-direction counter 38 also employed in the read-address counter 36 counts the number of clock periods repeatedly from 0 to 3, outputting the clock-period count to the address terminal of either the RAM 42#0 or the RAM 42#1 by way of the selector 40#0 or 40#1, respectively as an upper-order address. By a clock period, the counting period of the horizontal-direction counter 39 is meant.

Either one of the RAMs 42#0 or the 42#1 outputs an encoded list from a location indicated by an address signal supplied to the address terminal by way of a selector 48. In this way, the received signal is correctly deinterleaved to the preinterleave order 0, 1, 2 and so on. In the conventional bit interleave circuit and the conventional bit deinterleave circuit described above, since write and read operations are simply carried out in the horizontal and vertical directions as shown in FIGS. 22 to 24, if consecutive errors occur in the last bit of an interleave block and the first bit of the following interleave block, the consecutive errors will remain even after the bit deinterleave process, raising a problem that randomization of errors after the bit deinterleave process is not always sufficient.

In addition, when erroneous coded bits are supplied to the FEC decoder at the same time, the ability to correct an error deteriorates as is generally known. The probability of erroneous bits' being received at the same time increases as a burst error is generated on the radio transmission path. In order to solve this problem, the parallel output of the FEC encoder is converted into serial data prior to an bit interleave process in the conventional mobile communication/broadcasting system. On the receiver side, on the other hand, received serial data is converted into parallel data after a bit deinterleave process. In this way, it is possible to prevent input bits from becoming erroneous at the same time.

For the reason described above, it is necessary to operate the bit interleave circuit and bit deinterleave circuits employed in the conventional mobile communication/broadcasting system at a clock rate equal to the bit rate of codes. FIG. 24 is a diagram showing examples of operations carried out at a coding rate of 1/2. In this case, it is necessary to write and read data into and from a RAM at a clock rate twice as much as the bit rate of the information. In consequence, among other problems, there is raised an issue that not only is it difficult to implement a bit interleave circuit capable of operating at a high speed, but the amount of power consumption also increases as well.

SUMMARY OF THE INVENTION

It is thus an object of the present invention addressing the problems described above to provide a bit interleave circuit and a bit deinterleave circuit for implementing prevention of errors from further deteriorating and for implementing reduction of the power consumption by carrying out operations at a low speed.

In accordance with one aspect of the present invention, there is provided a bit deinterleave circuit bit deinterleaving a signal, the bit deinterleave circuit comprising: measurement means for measuring the reception level of each bit in a received signal completing a bit interleave process; command-signal generating means for outputting a command signal to indicate whether computation in error correction is to be inhibited or permitted for said bit on the basis of said reception level of each bit measured by said measurement means and a threshold value; first deinterleave means for deinterleaving said received signal completing a bit interleave process; and second deinterleave means for rearranging said command signals so as to output command signals according to a signal output by said first deinterleave means.

In accordance with another aspect of the present invention, there is provided a bit interleave circuit bit interleaving a signal, the bit interleave circuit comprising:random-access memory allowing operations based on an address signal to write and read data; first counter for carrying out a counting operation synchronized with an input encoded list and outputting a lower-order address of said address signal; second counter for carrying out a counting operation synchronized with counting periods of said first counter and outputting an upper-order address of said address signal; third counter for carrying out a counting operation synchronized with said input encoded list and outputting an upper-order address of said address signal; fourth counter for carrying out a counting operation synchronized with counting periods of said third counter and outputting a lower-order address of said address signal; and inverter circuit for inverting the most significant bit of either said second counter or said third counter.

The above and other objects, features and advantages of the present invention as well as the manner of realizing them will become more apparent, and the invention itself will be best understood from a study of the following description and appended claims with reference to attached drawings showing some preferred embodiments of the invention.

BRIEF DESCRIPTION OF THE DRAWINGS

FIG. 21 is an explanatory diagram used for explaining the read operation of the bit interleave circuit shown in FIG. 19;

DETAILED DESCRIPTION OF THE PREFERRED EMBODIMENTS

Figure 1:
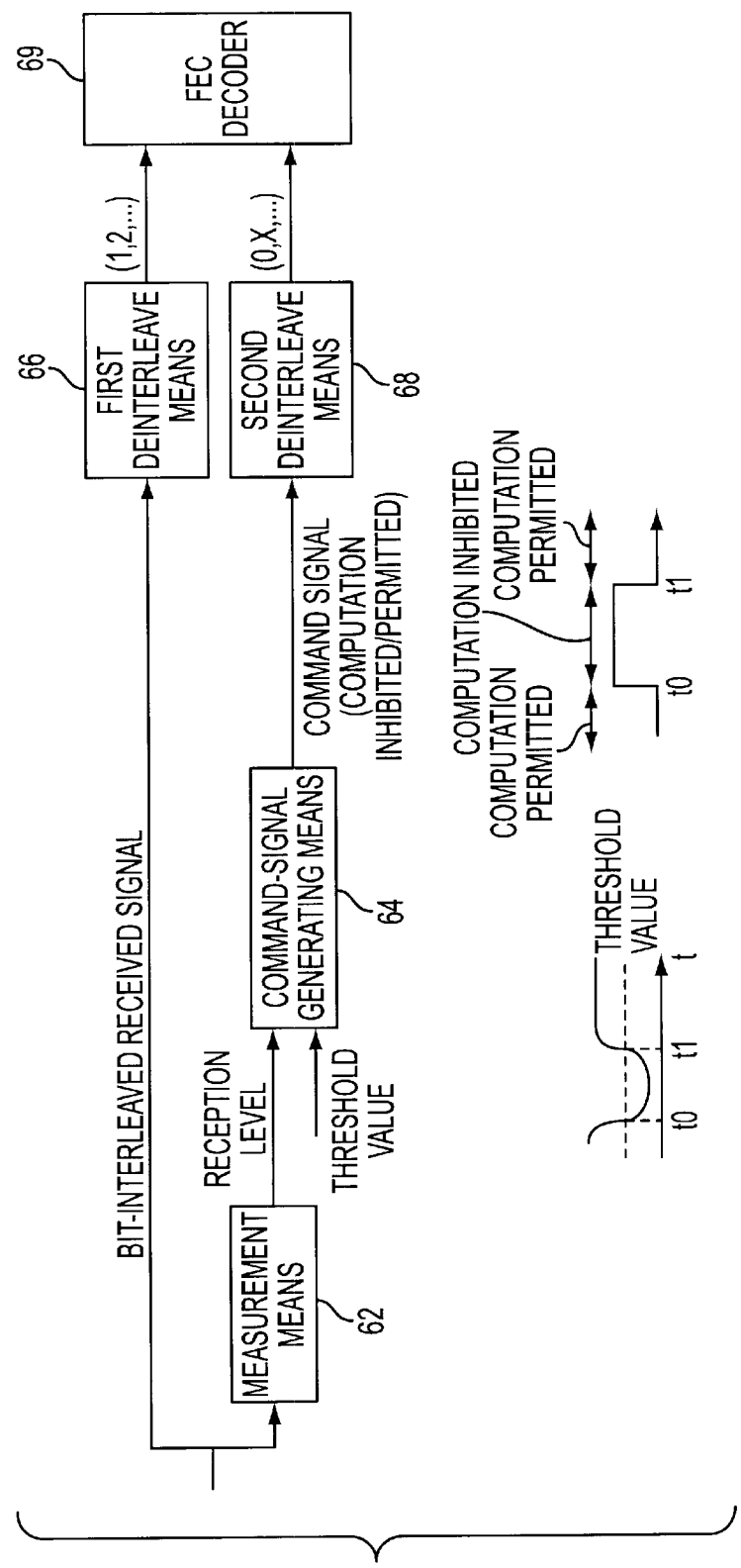
FIG. 1 is a diagram showing the principle of the present invention.

Before preferred embodiments of the present invention are explained, first of all, a principle underlying the invention is described by referring to FIG. 1. As shown in the figure, a bit deinterleave circuit comprises: a measurement means 62 for measuring the reception level of each bit in a received signal completing a bit interleave process; a command-signal generating means 64 for outputting a command signal to indicate whether computation in error correction is to be inhibited or permitted for each bit on the basis of the reception level of the bit measured by the measurement means 62 and a threshold value; a first deinterleave means 66 for deinterleaving the received signal completing a bit interleave process; and a second deinterleave means 68 for rearranging command signals so as to output the command signals according to a signal output by the first deinterleave means 66.

In such a configuration, the reception level measured by the measurement means 62 is information on the amplitude of each bit in a received signal completing a bit interleave process. This is because fading or shadowing attenuates the reception level and the reception-level attenuation makes the reception characteristic deteriorate. The command-signal generating means 64 compares the reception level of each bit measured by the measurement means 62 with a threshold value. For example, if the reception level of a bit is found lower than the threshold value, a command signal is issued to request that computation be inhibited as shown by an X mark in the figure. If the reception level of a bit is found higher than the threshold value, on the other hand, a command signal is issued to indicate that computation is allowed as shown by an ○ mark in the figure. Assume that the reception level of a bit is lower than the threshold value during the period t0 to t1. In this case, a command signal is issued to request that computation be inhibited during this period.

The first deinterleave means 66 deinterleaves the received signal completing a bit interleave process by rearranging bits in the signal. The second deinterleave means 68 rearranges command signals to output the command signals according to bits of a signal output by the first deinterleave means 66. An FEC decoder 69 receives bits of the received signal completing the bit deinterleave process and the command signals according to the bits. If a command signal for a bit indicates that computation is inhibited, a decoding process is carried out by excluding the bit from decoding computation. In this way, a BER characteristic can be prevented from deteriorating.

First Embodiment

Figure 2:
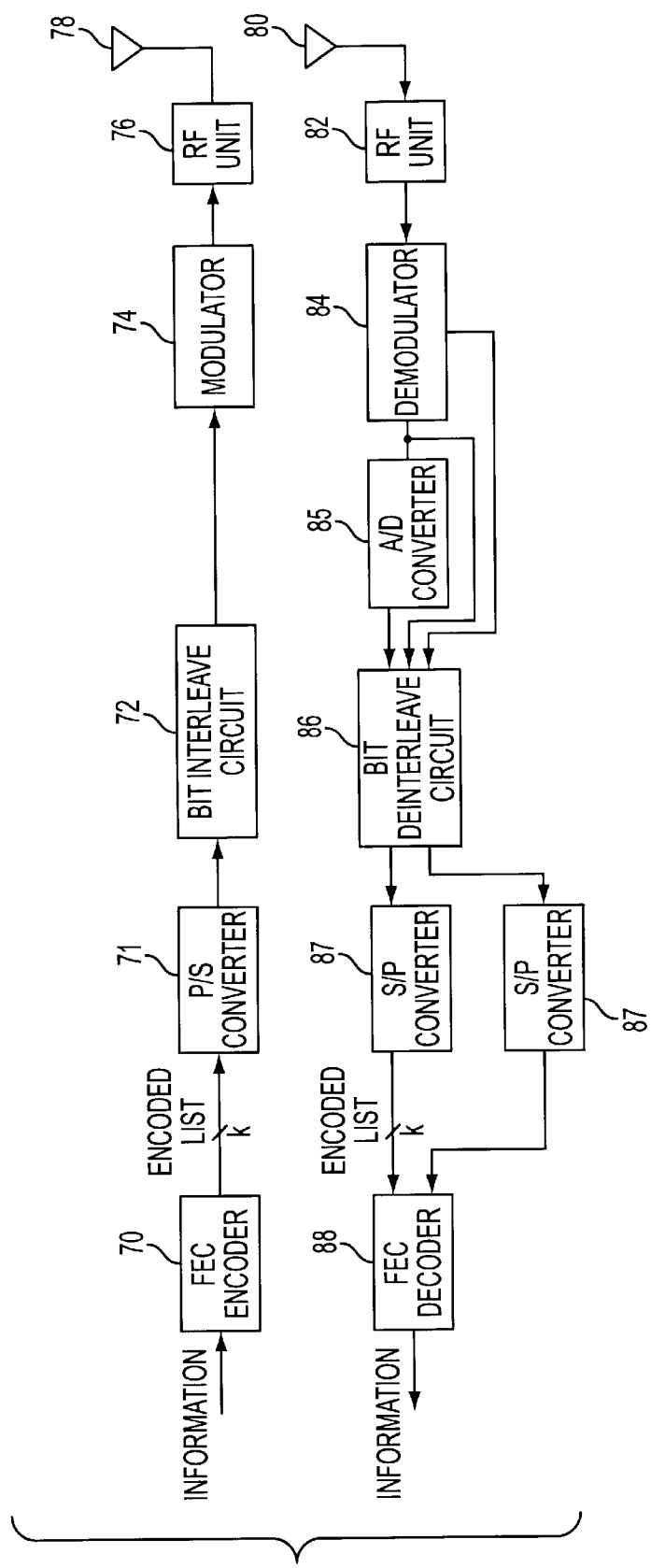
FIG. 2 is a diagram showing a configuration of a radio set including a bit interleave circuit and a bit deinterleave circuit which are implemented by a first embodiment of the present invention.

FIG. 2 is a diagram showing a radio set including a bit interleave circuit and a bit deinterleave circuit which are implemented by a first embodiment of the present invention. The radio set is a mobile station or a base station used in a mobile communication system or the like. As shown in the figure, the radio set comprises an FEC encoder 70, an P/S converter 71, a bit interleave circuit 72, a modulator 74, an RF unit 76, antennas 78 and 80, an RF unit 82, a demodulator 84, an A/D converter 85, a bit deinterleave circuit 86, an S/P converter 87 and an FEC decoder 88.

The FEC encoder 70 carries out an encoding process at a fixed encoding rate such as the convolution encoding process on incoming information to generate an encoded list of k bits. The P/S converter 71 converts the k-bit parallel data into serial data. The bit interleave circuit 72 carries out a bit interleave process on encoded serial data in a configuration like the one shown in FIG. 22. The modulator 74 modulates a signal completing the bit interleave process by adopting a predetermined modulation method such as the BPSK or QPSK. The RF unit 76 transforms frequencies of the modulated signal into a fixed frequency band and amplifies the signal. The antenna 78 transmits a transmission signal.

On the other hand, the antenna 80 receives a radio signal. The RF unit 82 extracts a signal in a fixed frequency band and carries out processing such as amplification on the extracted signal. The demodulator 84 measures the level of the received signal to output an RSSI (Received Signal Strength Indicator). At the same time, the demodulator 84 controls the amplitude of the received signal by using an AGC circuit and demodulates the received signal which was modulated by the BPSK or QPSK method, outputting a demodulated signal including amplitude information. The demodulator 84 generates a demodulated signal including amplitude information in order to increase the error correction capability of the FEC decoder 88. The A/D converter 85 converts the demodulated signal into a digital signal comprising a fixed number of quantization bits. Typically, the number of quantization bits is 3 with the code bit of the most significant,code bit being an encoded bit.

Figure 3:
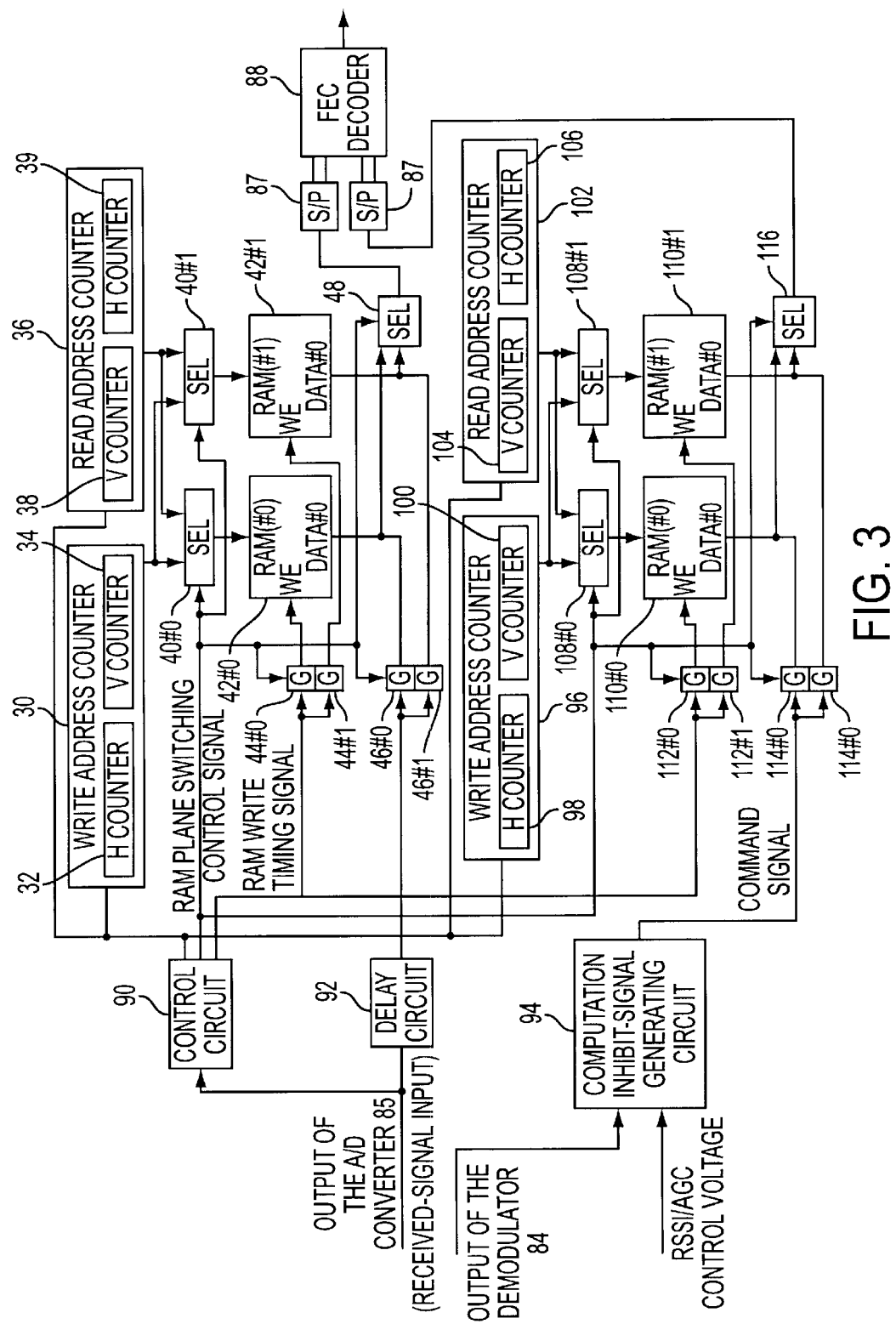
FIG. 3 is a diagram showing the configuration of the bit deinterleave circuit implemented by the first embodiment of the present invention.
Figure 23:
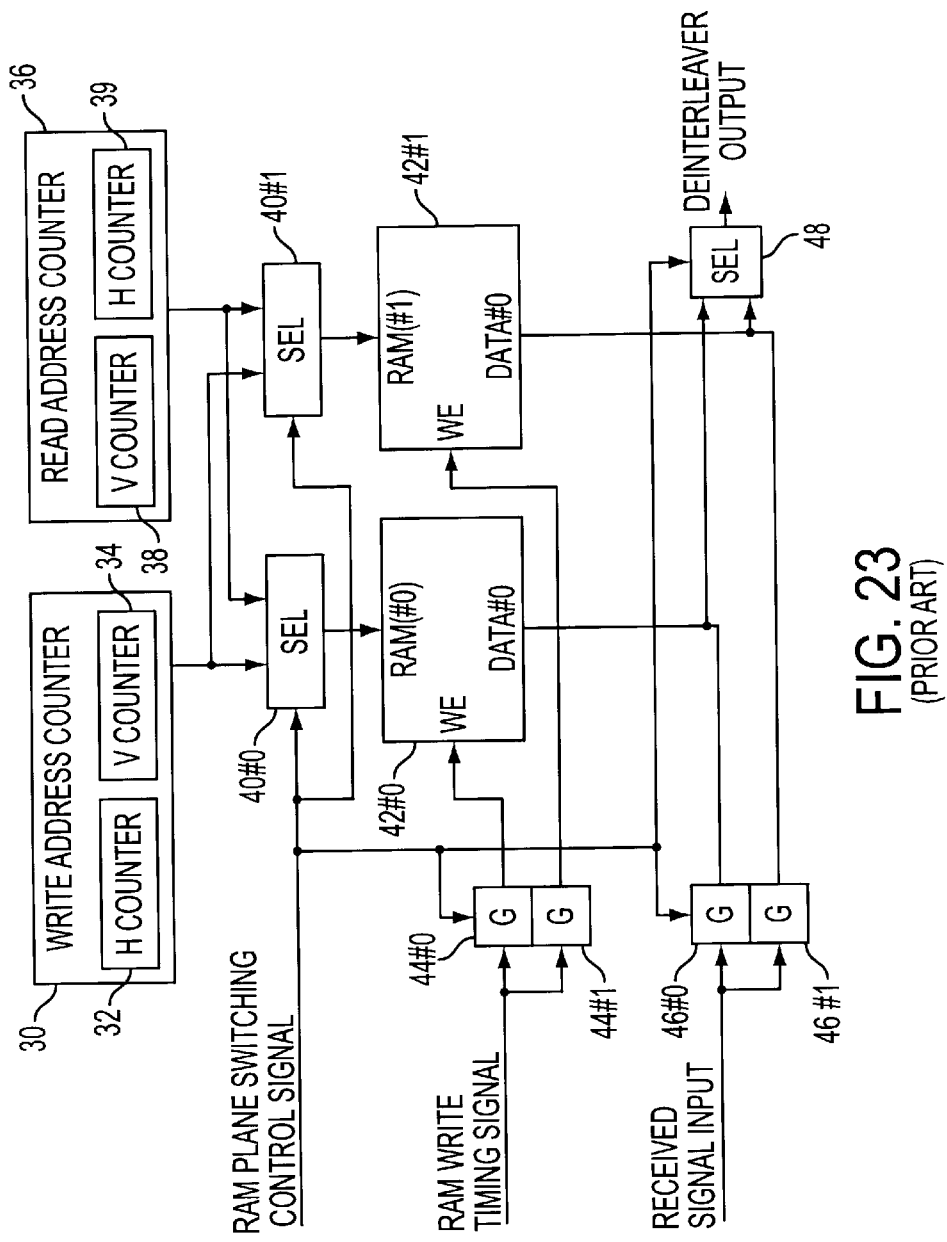
FIG. 23 is a diagram showing the configuration of the conventional bit deinterleave circuit.
Figure 24:
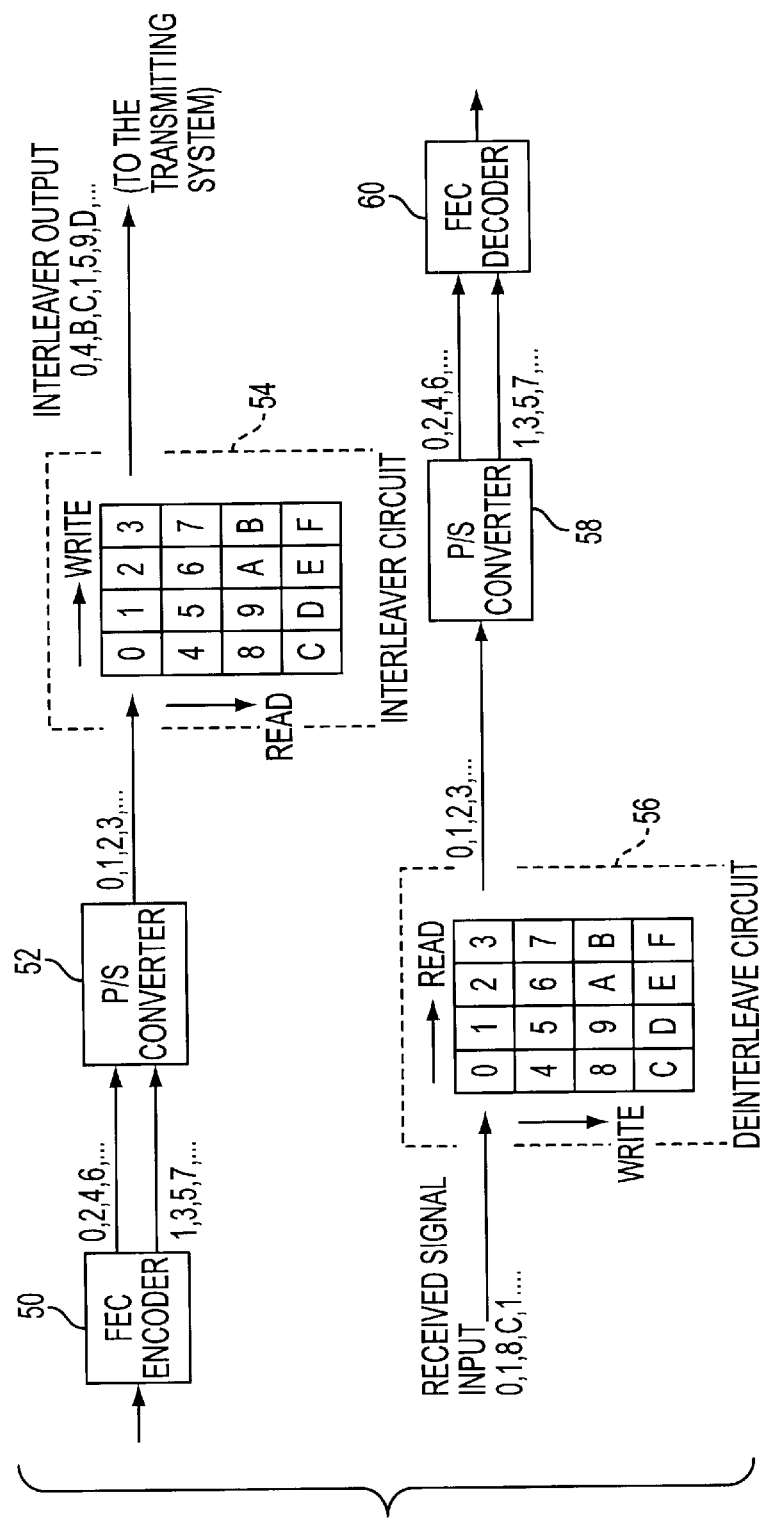
FIG. 24 is an explanatory diagram used for describing the operations of the bit interleave and bit deinterleave circuits shown in FIGS. 22 and 23, respectively.

FIG. 3 is a diagram showing the configuration of the bit deinterleave circuit 86 shown in FIG. 2. Components of the bit deinterleave circuit substantially identical with those shown FIG. 23 are denoted by the same reference numerals as the latter. As shown in FIG. 3, the bit deinterleave circuit 86 comprises a control circuit 90, a delay circuit 92, a computation-inhibit-signal generating circuit 94, a write address counter 30, a read address counter 36, selectors 40#0 and 40#1, RAMs 42#0 and 42#1, gate circuits 44#0, 44#1, 46#0 and 46#1, a selector 48, a write address counter 96, a read address counter 102, selectors 108#0 and 108#1, RAMs 110#0 and 110#1, gate circuits 112#0, 112#1, 114#0 and 114#1 and a selector 116. It should be noted that the RAMs 42#0 and 42#1 each have a width of 1 bit, and as many such RAMS as bits output by the A/D converter 85 are provided.

The control circuit 90 generates a clock signal synchronized with a received signal. In addition, the control circuit 90 also generates a RAM plane switching control signal and a RAM write timing signal for each interleave block of n×m bits in synchronization with the clock signal where the symbol n is the number of bits in the horizontal direction in the block whereas the symbol m is the number of bits in the vertical direction in the block. The delay circuit 92 is typically implemented by a shift register which operates on the basis of a clock signal synchronized with a received signal. The delay circuit 92 delays the received signal completing a bit interleave process by a predetermined delay time equal in length to a period between reception of bits of the received signal and generation of command signals by the computation-inhibit-signal generating circuit 94 to indicate that computation be inhibited or allowed for the bits.

Figure 4:
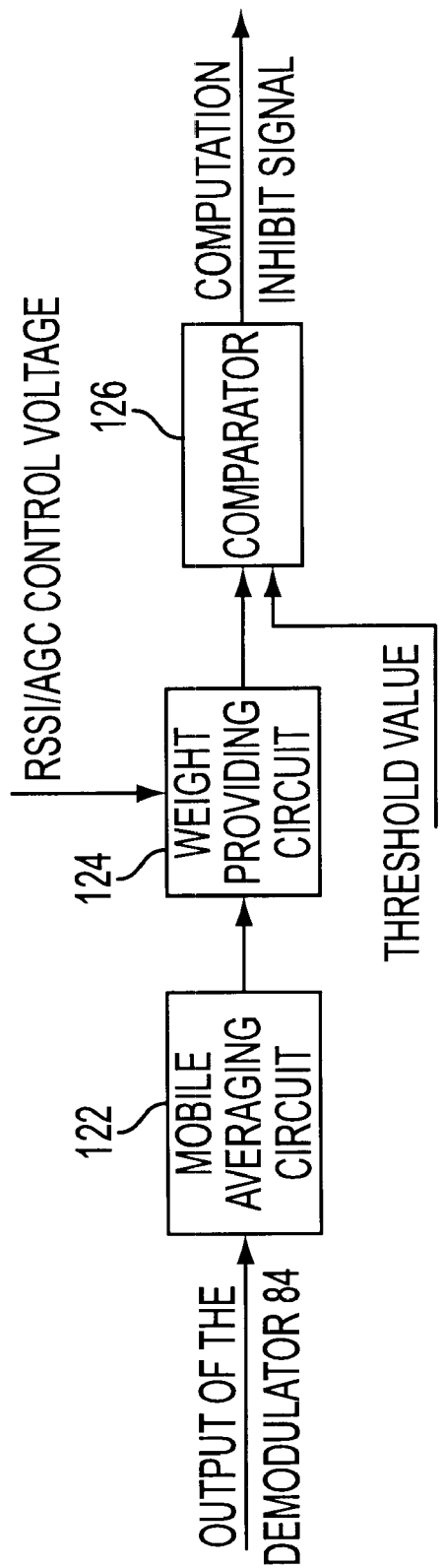
FIG. 4 is a block diagram showing the computation-inhibit-signal generating circuit employed in the bit deinterleave circuit shown in FIG. 3.

FIG. 4 is a block diagram showing the computation-inhibit-signal generating circuit 94 employed in the bit deinterleave circuit 86 shown in FIG. 3. As shown in FIG. 4, the computation-inhibit-signal generating circuit 94 comprises a mobile averaging circuit 122, a weight providing circuit 124 and a comparator 126. The mobile averaging circuit 122 detects the envelop of an analog signal output by the demodulator 84 and measures the level of the received signal. To be more specific, the mobile averaging circuit 122 measures the reception level of each bit in the received signal and computes an average of reception levels of bits in the received signal within a predetermined range preceding and succeeding the bit. Such an average is referred to hereafter as a mobile average. A mobile average is found in order to suppress an effect of noise generated by the radio set. This is because fading or shadowing attenuates the reception level and the reception-level attenuation gives rise to a continuous burst error.

The weight providing circuit 124 provides weights to reception levels of bits, which were subjected to the mobile-averaging process. The weights are found from the RSSI signal or an AGC control voltage output by the demodulator 84. For example, the reception levels of the bits are multiplied by the RSSI signal or the AGC control voltage. Weights are provided to the reception levels because of the following reason. Since the AGC circuit employed in the demodulator 84 adjusts the level of the received signal, from only the level of a signal output by the demodulator 84, it is impossible to determine the level which the received signal had at the time the received signal arrived the antenna 80. It is thus necessary to return the level of the received signal to that of the received signal which had at the time the received signal arrived at the antenna 80.

The comparator 126 compares the level of the received signal output by the weight providing circuit 124 with a threshold value (or a reference voltage). If the level of the received signal output by the weight providing circuit 124 exceeds the threshold value, the comparator 126 outputs a command signal set typically at a low level indicating that computation is allowed. If the level of the received signal output by the weight providing circuit 124 is equal to or lower than the threshold value, on the other hand, the comparator 126 outputs a command signal raised typically to a high level indicating that computation is inhibited. If the comparator 126 outputs a command signal indicating that computation is inhibited for a received signal, the FEC decoder 88 inhibits error-correction computation for the received signal with which the command signal is associated.

This is because, rather than applying error correction to the received signal as it is, a BER characteristic can be improved as is disclosed for example in a thesis authored by Yasuda et al. with a title of "High-Encoding-Rate Convolution with Easy Viterbi Decoding and its Characteristics," Communication Theory B, Vol. J64B, No. 7, pp. 573 to 580 (1981). As described above, the bit deinterleave circuit 86 shown in FIG. 3 comprises the write address counter 96, the read address counter 102, the selectors 108#0 and 108#1, the RAMs 110#0 and 110#1, the gate circuits 112#0, 112#1, 114#0 and 114#1 and the selector 116, those serve as a deinterleaver for deinterleaving command signals. The write address counter 96 includes a horizontal-direction address counter 98 and a vertical-direction address counter 100. By the same token, the read address counter 102 includes a horizontal-direction counter 106 and a vertical-direction counter 104.

Except for the fact that a command signal is supplied to the gate circuits 114#0 and 114#1, the operation of this deinterleaver is substantially the same as that of the write address counter 30, the read address counter 36, the selectors 40#0 and 40#1, the RAMs 42#0 and 42#1, the gate circuits 44#0, 44#1, 46#0 and 46#1 and the selector 48. It should be noted that the write address counter 96, the read address counter 102, the selectors 108#0 and 108#1 as well as the gate circuits 112#0 and 112#1 can be shared with the deinterleaver of the received signal.

The operation of the radio set shown in FIG. 2 is explained as follows. Assume that the antenna 80 shown in FIG. 2 receives a modulated signal which was processed by using the same encoding system as the FEC encoder 70, the same bit interleave system as the bit interleave circuit 72 and the same modulation system as the modulator 74. Examples of the encoding system, the bit interleave system and the modulation system are the convolution encoding technique, the 4×4 interleave blocking technique and the BPSK modulation method, respectively. The RF unit 82 extracts a signal of a fixed frequency band from the signal received by the antenna 80. The demodulator 84 finds an RSSI signal from the received signal and then, after executing AGC control, demodulates the received signal, which was modulated by using typically the BPSK method, into a signal including amplitude information. The modulated signal is then supplied to the A/D converter 85. On the other hand, the RSSI signal and the AGC control voltage are supplied to the bit deinterleave circuit 86.

Figure 5:
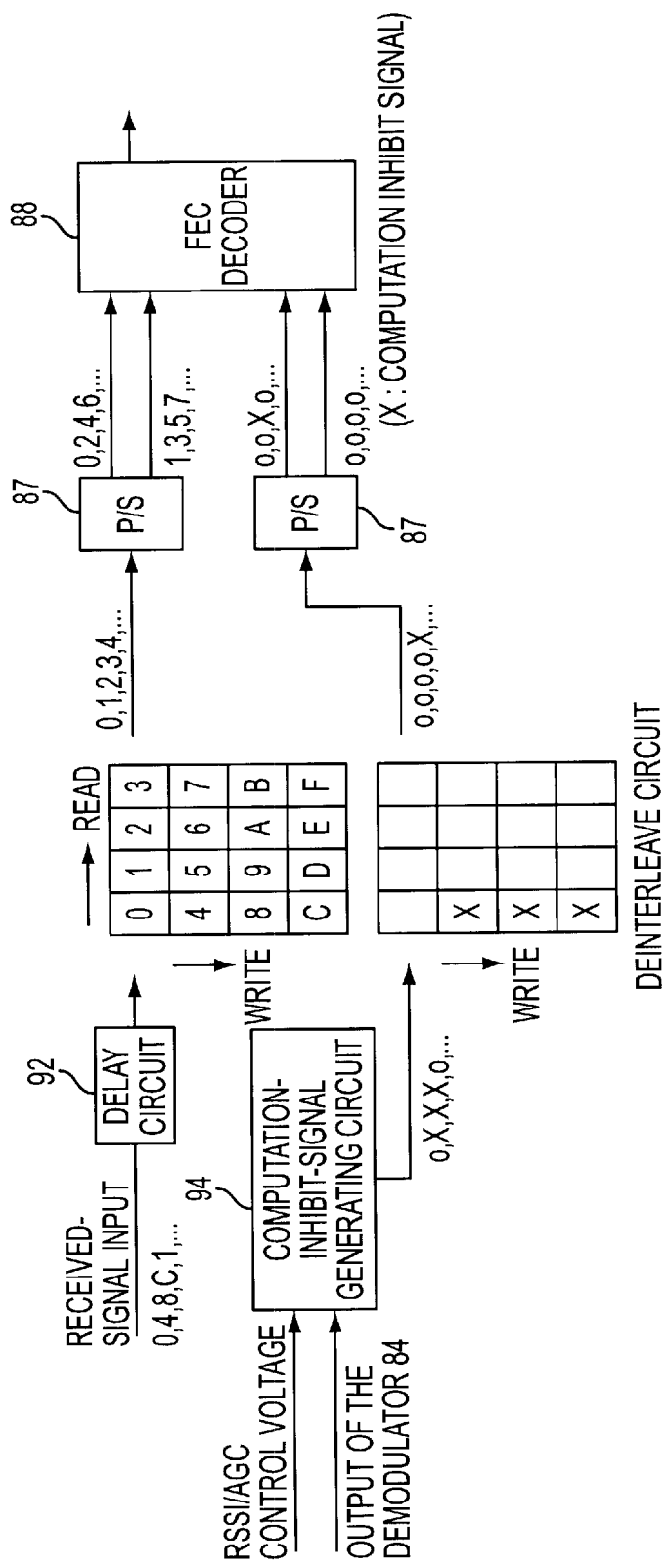
FIG. 5 is an explanatory diagram used for describing the operation of the bit deinterleave circuit shown in FIG. 3.

The A/D converter 85 converts the modulated signal received thereby into a digital signal with a fixed number of quantization bits. The coded bits of the quantization bits are encoded bits completing a bit interleave process and the remaining bits represent amplitude information. FIG. 5 is an explanatory diagram used for describing the operation of the bit deinterleave circuit shown in FIG. 3. The control circuit 90 generates a clock signal synchronized with a received signal. In addition, the control circuit 90 also generates a RAM plane switching control signal and a RAM write timing signal each time a bit interleave block of typically 4×4 bits is received. The delay circuit 92 delays the received signal by a fixed period of time in order to synchronize the bits of the received signal with command signals each indicating whether computation is inhibited or permitted.

The mobile averaging circuit 122 shown in FIG. 4 measures the level of the amplitude of the received signal by detecting typically the envelop of the received signal. The mobile averaging circuit 122 then finds an average of the levels of the received signal in a predetermined range including bits of the received signal, supplying the average to the weight providing circuit 124. The weight providing circuit 124 provides weights to a signal output by the mobile averaging circuit 122. The weights are based on the RSSI signal and the AGC control voltage. For example, the signal output by the mobile averaging circuit 122 is multiplied by the RSSI signal and the AGC control voltage. The weighted signal is then supplied to the comparator 126.

Figure 6:
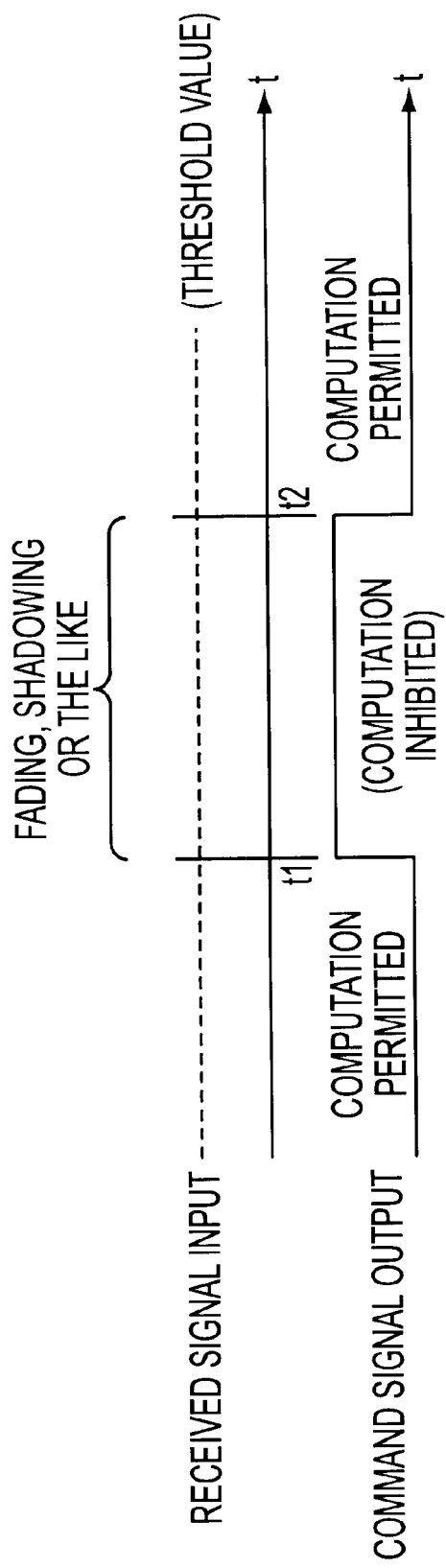
FIG. 6 is a diagram showing a computation-inhibit command signal.

The comparator 126 compares the level of the received signal output by the weight providing circuit 124 with a threshold value (or a reference voltage). If the level of the received signal output by the weight providing circuit 124 exceeds the threshold value, the comparator 126 outputs a computation-permit command signal set typically at a low level indicating that computation is allowed. If the level of the received signal output by the weight providing circuit 124 is equal to or lower than the threshold value, on the other hand, the comparator 126 outputs a computation-inhibit command signal raised typically to a high level indicating that computation is inhibited. The comparator 126 outputs the command signal to the gate circuits 114#0 and 114#1 shown in FIG. 3. FIG. 6 is a diagram showing the computation-inhibit command signal output by the comparator 126. As shown in FIG. 6, during the period t1 to t2 in which the level of a received signal is lower than the threshold value due to fading, shadowing or the like, the computation-inhibit command signal is active, being typically raised to a high level. During other periods in which the level of a received signal is higher than the threshold value, the computation-permit command signal is active, being typically set a low level.

The write address counter 30, the selectors 40#0 and 40#1 as well as the gate circuits 44#0, 44#1, 46#0 and 46#1 cause one interleave block (0, 4, 8, C and so on) to be written into either the RAM 42#0 or 42#1 at addresses (0, 4, 8, C and so on), respectively as shown in FIG. 5. In the mean time, the write address counter 96, the selectors 108#0 and 108#1 as well as the gate circuits 112#0, 112#1, 114#0 and 114#1 cause command signals (○, X, X, X, ○ and so on) for the 1-block bits (0, 4, 8, C and so on) to be written into either the RAM 110#0 or 110#1 at the same addresses as the block bits have been written as shown in FIG. 5.

On the other hand, the read address counter 36 as well as the selectors 40#0 and 40#1 cause 1-block bits (0, 1, 2, 3, 4 and so on) to be read out from either the RAM 42#0 or the RAM 42#1 and deinterleaved before being supplied to the S/P converter 87 by way of the selector 48 as shown in FIG. 5. In the mean time, the read address counter 102 as well as the selectors 108#0 and 108#1 cause command signals (○, ○, ○, ○, X and so on) for the 1-block bits (0, 1, 2, 3, 4 and so on) to be read out from either the RAM 110#0 or the RAM 110#1 before being supplied to the S/P converter 87 by way of the selector 116 as shown in FIG. 5.

The S/P converter 87 converts each of deinterleaver outputs (0, 1, 2, 3, 4 and so on) of the received signal and deinterleaver outputs (○, ○, ○, ○, X and so on) of the command signals into k-bit parallel data which is then output to the FEC decoder 88. The FEC decoder 88 receives the parallel data from the S/P converter 87, decoding the data by adoption of typically the viterbi decoding technique. In the decoding process, an interleaver output is set at a value having no effect on a judgment if the computation-inhibit command signal for the interleaver output is active. In this way, error computation for an erroneous code caused by fading, shadowing or the like is inhibited. As a result, deterioration of the BER characteristic after the error correction can be suppressed.

Figure 7:
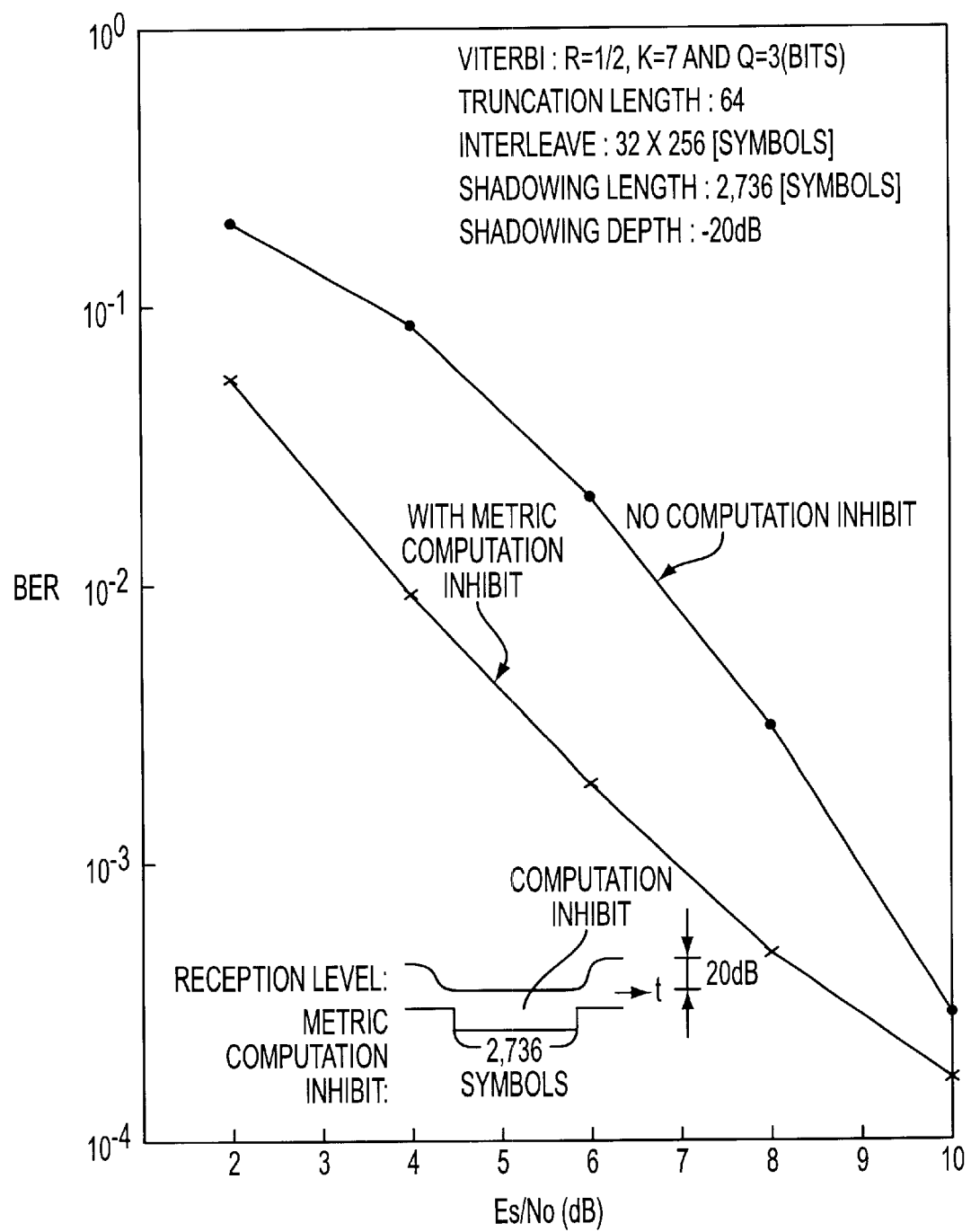
FIG. 7 is an explanatory diagram showing effects of the bit deinterleave circuit shown in FIG. 3.

FIG. 7 is an explanatory diagram showing effects of the bit deinterleave circuit shown in FIG. 3. The horizontal axis of FIG. 7 represents a ratio $Es/N_o$ [dB] where the symbol Es is an encoding energy per bit and the symbol $N_o$ is an energy per 1 Hz of noise. On the other hand, the vertical axis represents the BER. The figure shows curves for cases with and without the computation-inhibit command signal. In both the cases, the encoding rate R=1/2, the number of stages in the shift register k=7, the number of quantization bits Q=3, the truncation length of viterbi decoding=64, the interleave block length=32×256 bits, the shadowing length (a segment of computation inhibition due to shadowing)=2, 736 bits and the depth of the reception level caused by shadowing=−20 dB. As shown in the figure, in the case with a computation-inhibit command signal, the BER is small in comparison with the case without a computation-inhibit command signal. It is thus obvious from the figure that deterioration of the BER characteristic caused by fading, shadowing or the like can be suppressed.

Second Embodiment

Figure 8:
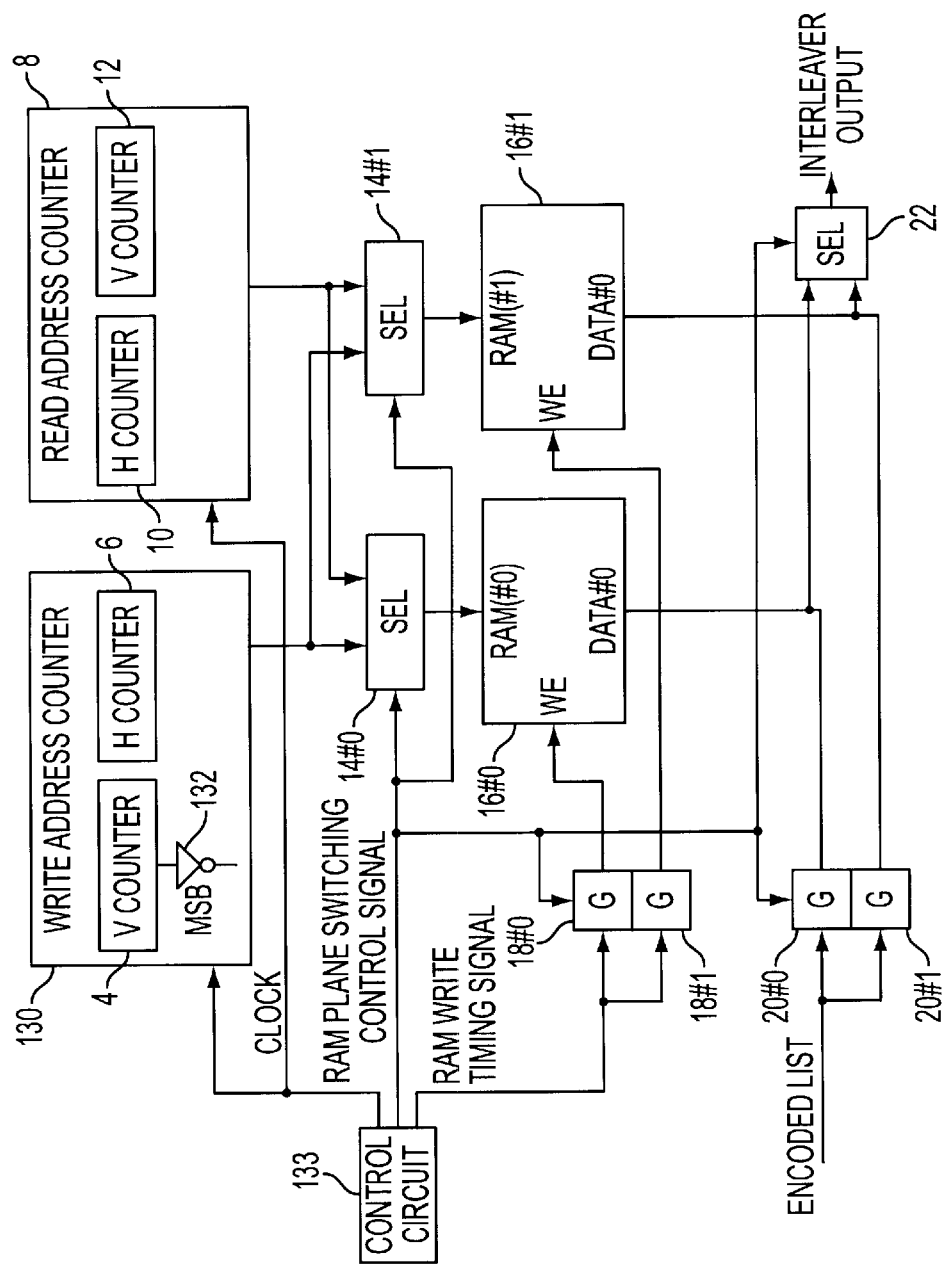
FIG. 8 is a diagram showing the configuration of a bit interleave circuit implemented by a second embodiment of the present invention.
Figure 22:
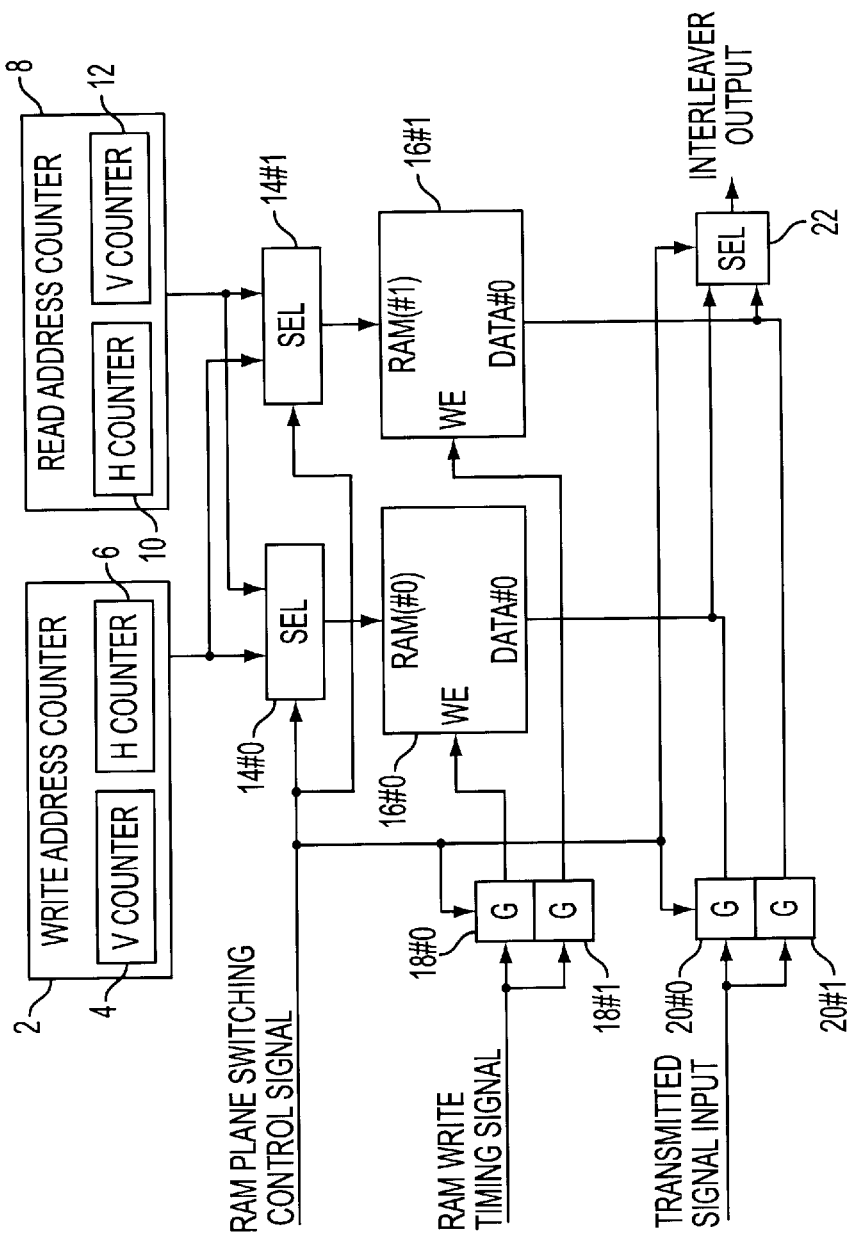
FIG. 22 is a diagram showing the configuration of the conventional bit interleave circuit.

FIG. 8 is a diagram showing the configuration of a bit interleave circuit implemented by a second embodiment of the present invention. Components of the second embodiment identical with those shown in FIG. 22 are denoted by the same reference numerals as the latter. The bit interleave circuit implemented by the second embodiment is different from the conventional bit interleave circuit in that, in the case of the former, a post-interleave distance between two adjacent bits in the same interleave block is kept at least at a predetermined value. In addition, in the case of the second embodiment, the distance between the last bit in an interleave block and the first bit in the immediately succeeding interleave block is set at least 2.

The bit interleave circuit shown in FIG. 8 is different from the bit interleave circuit shown in FIG. 22 in that the former of FIG. 8 includes an inverter 132 for inverting the most significant bit (MSB) of the output of the vertical-direction counter 4 employed in the write address counter 130. The inverter 132 is provided for the following reason. Assume that the RAMs 16#0 and 16#1 are each a memory area with a matrix form of n×m bits where the symbol n is the number of bits in the horizontal direction and the symbol m is the number of bits in he vertical direction. The memory area is divided into two blocks, namely, an upper-side block and a lower-side block. Bits in the first half of an interleave block are written sequentially into the lower-side block of the memory area and bits in the remaining second half of the interleave block are written sequentially into the upper-side block of the memory area.

As a result, the post-interleave distance between two adjacent bits in the same interleave block is m whereas the distance between the last bit in an interleave block and the first bit in the immediately succeeding interleave block is n×m. In addition, the post-interleave distance between two adjacent bits in the same interleave block and in the adjacent blocks is set at least at a predetermined value. In the case of a 4×4 interleave block, for example, the post-interleave distance between two consecutive bits has a maximum value of 16 bits, a minimum value of 4 bits and an average value of 6.9 bits. These values are larger than the conventional post-interleave distance between two consecutive bits which has a maximum value of 11 bits, a minimum value of 1 bit and an average value of 5.1 bits, respectively.

As described above, the RAMs 16#0 and 16#1 employed in this embodiment are each a memory area with a matrix form divided into two blocks (an upper and a lower portions). It should be noted the memory area can also be divided into three or more blocks into which bits of an interleave block are written. In this case, a plurality of most significant bits in the vertical-direction counter 4 are inverted. In addition, data can be stored in the upper-side and lower-side blocks in this embodiment in the same way as the conventional system. In this case, an inverter is typically provided to invert the most significant bit of a vertical-direction counter 12 employed in a read address counter 8. In such a configuration, after bits of the lower-side block are read out in the vertical direction, bits of the upper-side block are read out in the vertical direction.

Figure 9:
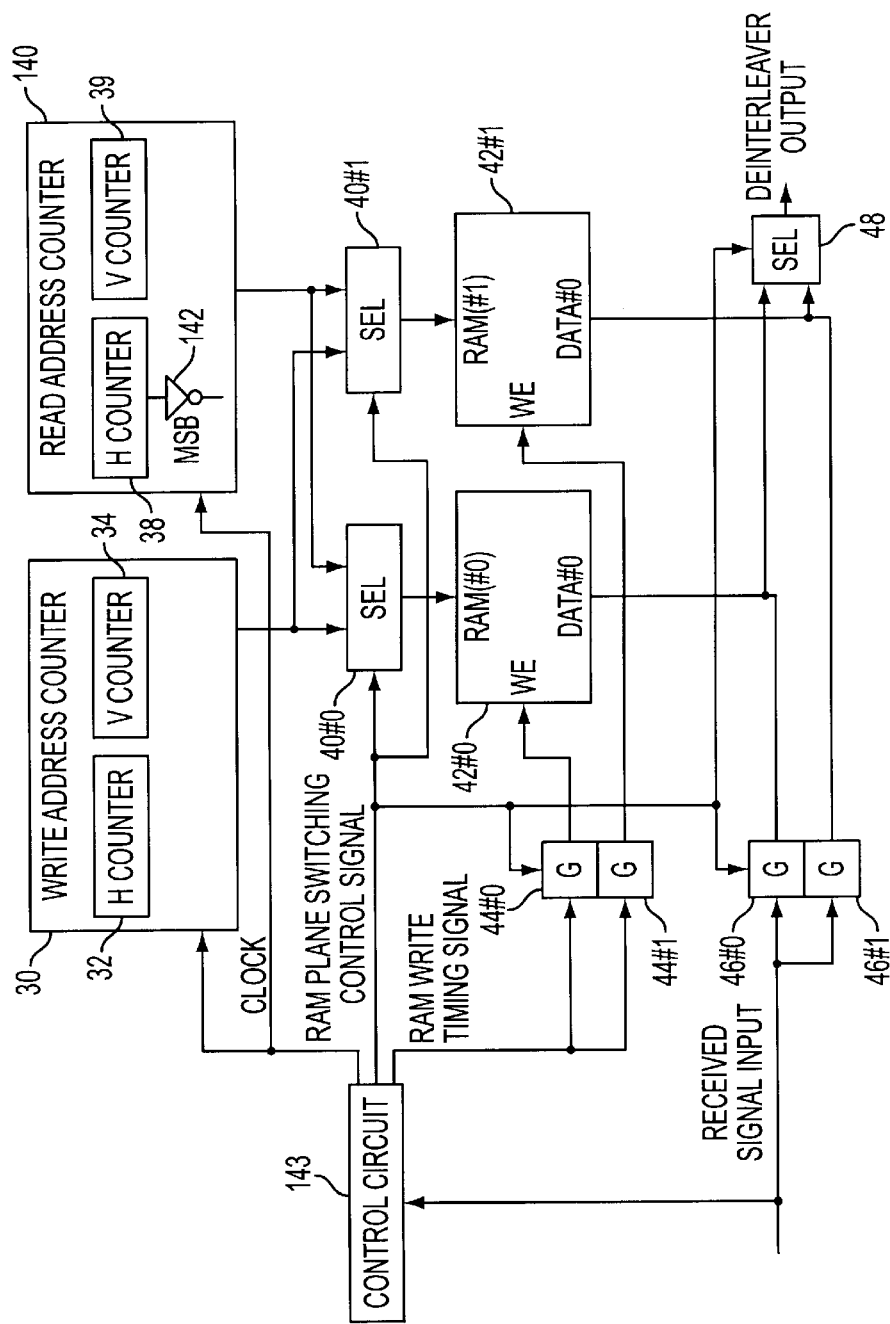
FIG. 9 is a diagram showing the configuration of a bit deinterleave circuit implemented by the second embodiment of the present invention.
Figure 10:
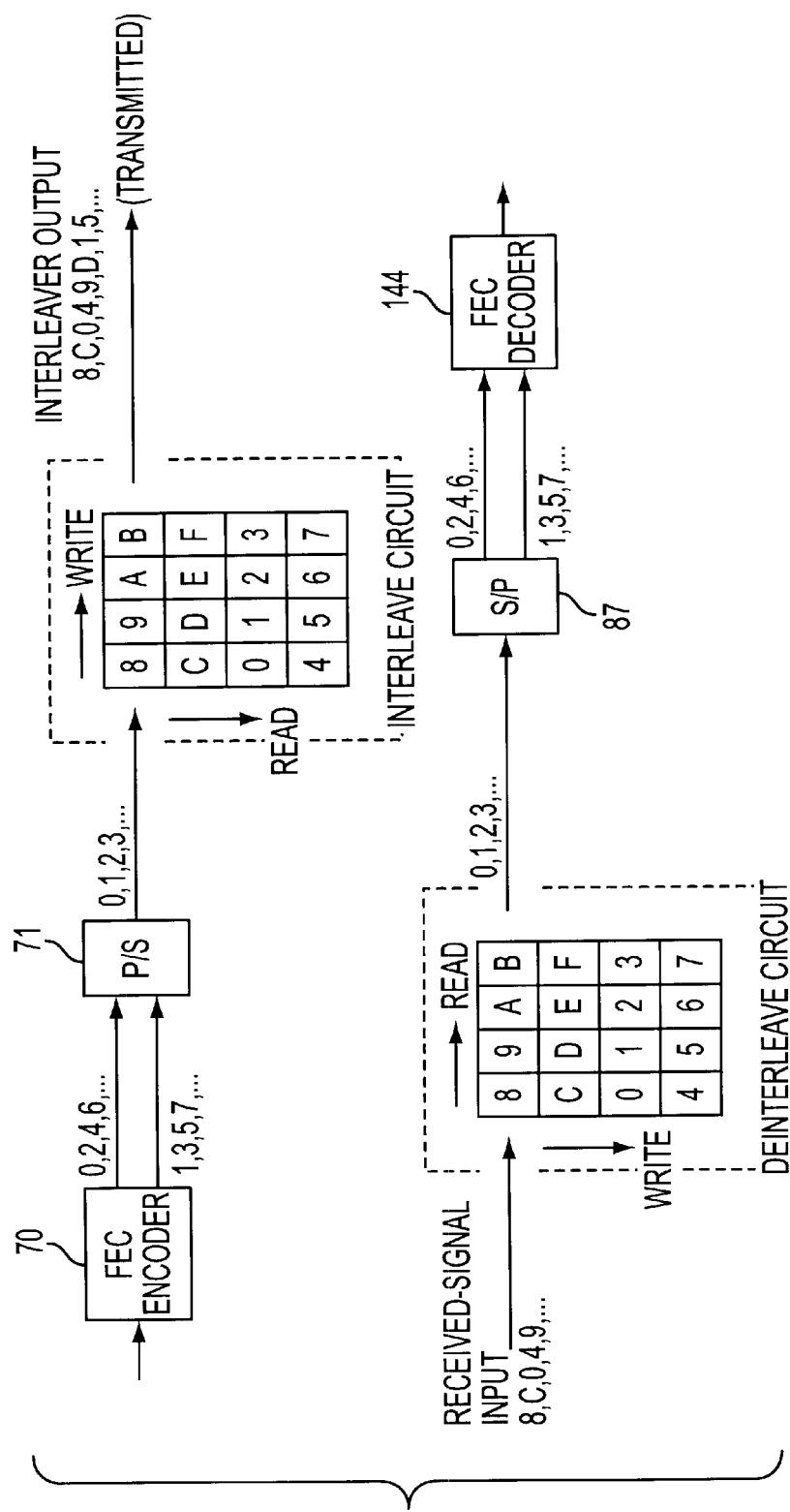
FIG. 10 is an explanatory diagram used for describing the operations of the bit interleave circuit and the bit deinterleave circuit shown in FIGS. 8 and 9, respectively.

Furthermore, in a bit interleave circuit, instead of a write operation in the horizontal direction shown in FIG.10, a write operation in the vertical direction can also be adopted. Then, in the bit interleave circuit, instead of a read operation in the vertical direction shown in FIG.10, a read operation in the horizontal direction can also be adopted. In order to implement this scheme of write and read operations, the MSB of the horizontal-direction counter 6 or 10 is inverted. FIG. 9 is a diagram showing the configuration of a bit deinterleave circuit implemented by the second embodiment of the present invention. Components of the second embodiment substantially identical with those shown in FIG. 23 are denoted by the same reference numerals as the latter. The bit deinterleave circuit shown in FIG. 9 deinterleaves a received signal interleaved by the bit interleave circuit shown in FIG. 8.

The bit deinterleave circuit shown in FIG. 9 is different from the bit deinterleave circuit shown in FIG. 23 in that the former shown in FIG. 9 includes an inverter 142 for inverting the most significant bit (MSB) of the output of a vertical-direction counter 38 employed in a read address counter 140. It should be noted that this embodiment includes the inverter 142 for inverting the most significant bit (MSB) of the output-of the vertical-direction counter 38 employed in the read address counter 140 as described above. In place of the inverter 142, this embodiment can include an inverter for inverting the most significant bit (MSB) of the output of a horizontal-direction counter 32 employed in a write address counter 30. As an alternative, instead of such inverters, this embodiment may include an inverter for inverting the most significant bit (MSB) of the output of a horizontal-direction counter 39 employed in the read address counter 140 or an inverter for inverting the most significant bit (MSB) of the output of a vertical-direction counter 34 employed in the write address counter 30. In this alternative configuration, the orders of read and write operations are reversed. To be more specific, the order of a read operation begins with an operation in the horizontal direction and ends with an operation in the vertical direction while a write operation begins with an operation in the vertical direction and ends with an operation the horizontal direction.

FIG. 10 is an explanatory diagram used for describing the operations of the bit interleave circuit and the bit deinterleave circuit shown in FIGS. 8 and 9, respectively.

(a) Description of the Operation of the Bit Interleave Circuit Shown in FIG. 8

A horizontal-direction control 6 employed in a write-address counter 30 repeatedly counts the number of clocks synchronized with bits of a transmission signal output by a control circuit 133 from 0 to (n−1). On the other hand, a vertical-direction counter 4 also employed in the write-address counter 30 repeatedly counts the number of clock periods from 0 to (m−1). By a clock period, the counting period of the horizontal-direction counter 6 is meant. An inverter 132 inverts the MSB of vertical-direction counter 4. The output of the horizontal-direction counter 6 and the output of the inverter 132 are supplied to the address terminal of the RAM 16#0 or the RAM 16#1 by way of the selector 14#0 or 14#1, respectively as a lower-order address (also known as a column address) and a most significant bit, respectively. By the same token, the output of the vertical-direction counter 4 except the most significant bit thereof is supplied to the address terminal of the RAM 16#0 or the RAM 16#1 by way of the selector 14#0 or 14#1, respectively as an upper-order address (also known as a row address) excluding the most significant address bit thereof.

Encoded lists are alternately written into the RAMs 16#0 and 16#1 in bit-interleave-block units each having dimensions of n×m bits in accordance with a RAM plane switching control signal output by the control circuit 133. At that time, the most significant bit of the vertical-direction counter 4 is inverted by the inverter 132. Thus, an interleave block is written into a memory area with a form of a matrix having dimensions of n×m bits as two sub-blocks. To put it in detail, the first sub-block, that is, the first half of an interleave block, is written into the lower half of the memory area. On the other hand, the second sub-block, that is, the second half of the interleave block, is written into the upper half of the memory area.

In the case of n=m=4, for example, a list segment of (0, 1, 2, 3) is written into a vertical-direction address of 2, a list segment of (4, 5, 6, 7) is written into a vertical-direction address of 3, a list segment of (8, 9, A, B) is written into a vertical-direction address of 0 and a list segment of (C, D, E, F) is written into a vertical-direction address of 1 as shown in FIG. 10. A vertical-direction counter 12 employed in a read-address counter 8 repeatedly counts the number of clocks generated by a control circuit 133 from 0 to (m−1), outputting the clock count to the address terminal of either a RAM 16#0 or a RAM 16#1 by way of a selector 14#0 or 14#1, respectively as an upper-order address (or known as a row address).

On the other hand, a horizontal-direction counter 10 also employed in the read-address counter 8 repeatedly counts the number of clock periods from 0 to (n−1), outputting the clock-period count to the address terminal of either the RAM 16#0 or the RAM 16#1 by way of the selector 14#0 or 14#1, respectively as a lower-order address (or known as a column address). By a clock period, the counting period of the horizontal-direction counter 12 is meant. Encoded lists are alternately read out from the RAMs 16#0 and 16#1 in bit-interleave-block units each having dimensions of n×m bits in accordance with a RAM plane switching control signal. In the case of n=m=4, for example, the interleaver output is 8, C, 0, 4, 9, D, 1, 5, A, E and so on as shown in FIG. 10. As a result, the post-interleave distance between two adjacent bits in the same interleave block is m whereas the distance between the last bit in an interleave block and the first bit in the immediately succeeding interleave block is m×n.

(b) Description of the Operation of the Bit Deinterleave Circuit Shown in FIG. 9

Figure 11A:
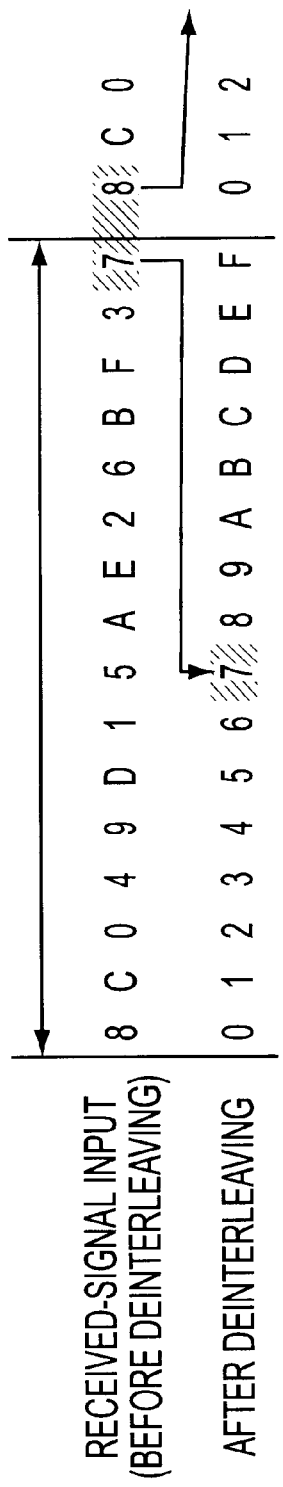
FIG. 11A is a diagram showing output of a bit deinterleave circuit shown in FIG. 9.

In a write-address counter 30, a horizontal-direction counter 32 and a vertical-direction counter 34 count the number of clocks generated by a control circuit 143 in synchronization with a received signal, outputting the count results to a RAM 42#0 or 42#1 by way of a selector 40#0 or 40#1, respectively. Each time one interleave block is received, the interleave block is written into the RAM 42#0 or 42#1 selected alternately by the RAM plane switching control signal output by the control circuit 143. FIG. 11 is a diagram showing outputs of the bit deinterleave circuit shown in FIG. 9. In the case of n=m=4, the interleaver output is 8, C, 0, 4, 9, 1, 5 and so on as shown in FIG. 11(a) where the numbers i in the output are order numbers before the bit interleave process carried out on the transmitter side. This interleave output is written into a memory area so that a list segment of (8, C, 0, 4) is written into a horizontal-direction address of 0, a list segment of (9, D, 1, 2) is written into a horizontal-direction address of 1, a list segment of (A, E, 2, 6) is written into a horizontal-direction address of 2 and a list segment of (B, F, 3, 7) is written into a horizontal-direction address of 3 as shown in FIG. 10.

In a read-address counter 140, a horizontal-direction counter 39 and a vertical-direction counter 38 count the number of clocks output by a control circuit 143 in synchronization with a received signal whereas an inverter 142 inverts the most significant bit of the vertical-direction counter 38. The count results are output to a RAM 42#0 or 42#1 by way of a selector 40#0 or 40#1, respectively. Each time one interleave block is received, interleave blocks are read out sequentially from the RAM 42#0 or 42#1 selected alternately by a RAM plane switching control signal generated by the control circuit 143.

Figure 11B:
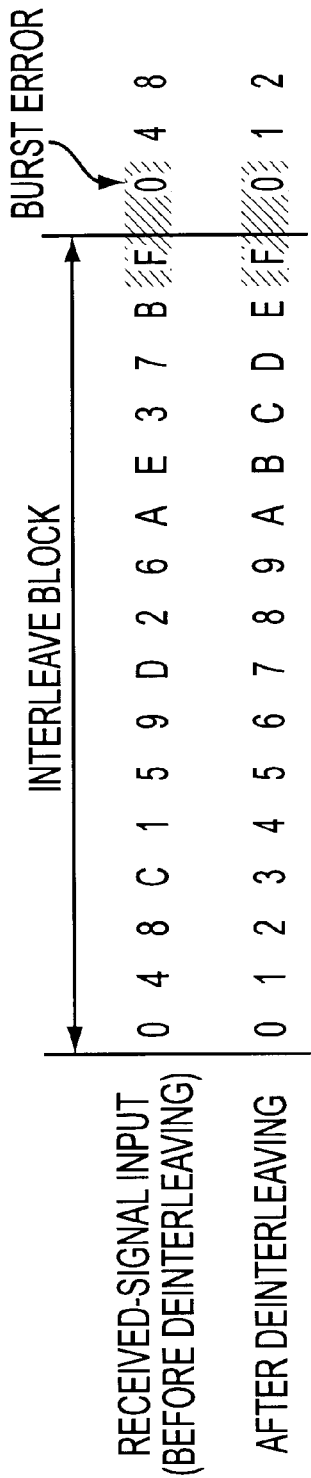
FIG. 11B is a diagram showing a conventional case in which two consecutive erroneous bits appear result of bit deinterleave process.

Since the most significant bit of the vertical-direction counter 38 employed in the read-address counter 140 is inverted, in the case of n=m=4, for example, segment lists are read out from the memory area at a vertical-direction-address order of 2, 3, 0 and 1 to generate a list of (0, 1, 2, 3, 4 and so on) as shown in FIGS. 10 and 11A. As shown by hatched blocks in FIG. 11A, the distance between the last bit in an interleave block and the first bit in the immediately succeeding interleave block is 16. As a result, even in the event of a burst error spreading over two consecutive interleave blocks, bits involved in the burst error are separated by a distance of 16, being subjected to the bit deinterleave process. FIG. 11B is a diagram showing a conventional case in which two consecutive erroneous bits appear as a result of a bit deinterleave process. Deterioration of the BER characteristic in the case shown in FIG. 11A is suppressed more than the case shown in FIG. 11B.

Third Embodiment

Figure 12:
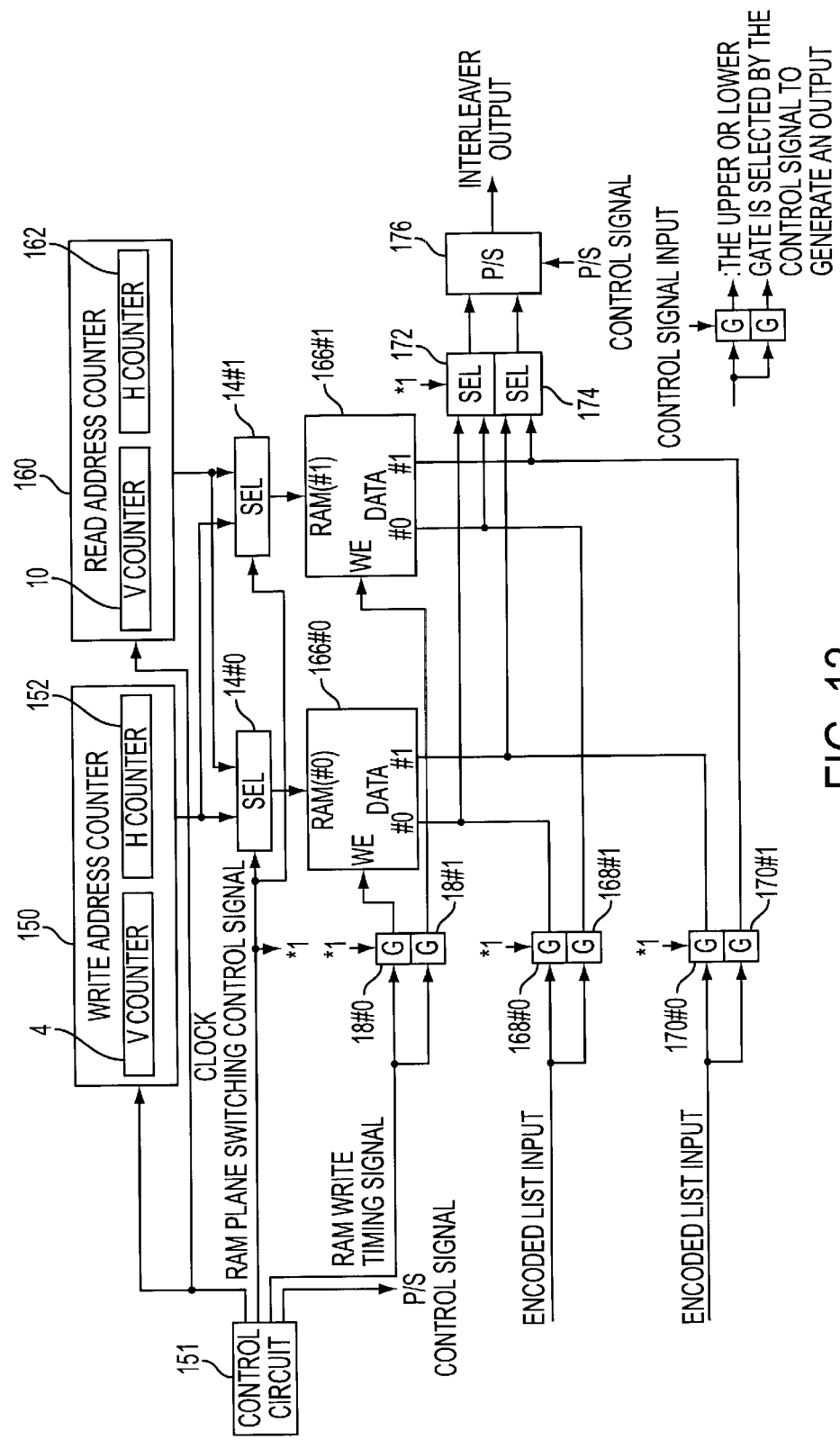
FIG. 12 is a diagram showing the configuration of a bit interleave circuit implemented by a third embodiment of the present invention.

FIG. 12 is a diagram showing the configuration a bit interleave circuit implemented by a third embodiment of the present invention. Components of the third embodiment substantially identical with those shown in FIG. 22 are denoted by the same reference numerals as the latter. The bit interleave circuit implemented by the third embodiment is different from the conventional bit interleave circuit in that:

(1) Since a k-bit parallel encoded list is written into a RAM 166#0 or 166#1 at the same time, the data widths of the RAMs 166#0 and 166#1 are each set at k bits.

(2) A horizontal-direction counter 152 employed in a write address counter 150 and a horizontal-direction counter 162 employed in a read address counter 160 count from 0 to n1 where n1=(n/k)−1.

(3) There are provided gate circuits 168#0, 168#1, 170#0 and 170#1 for receiving a k-bit parallel encoded list where k is 2. Selectors (SELS) 172 and 174 are provided at the outputs of the RAMs 166#0 and 166#1. As many such selectors as data output portions of the RAM 166#0 or 166#1 are required.

(4) On the output side of the selectors 172 and 174, there is provided a P/S converter 176 for converting parallel outputs of the RAMs 166#0 and 166#1 into a serial output.

Figure 13:
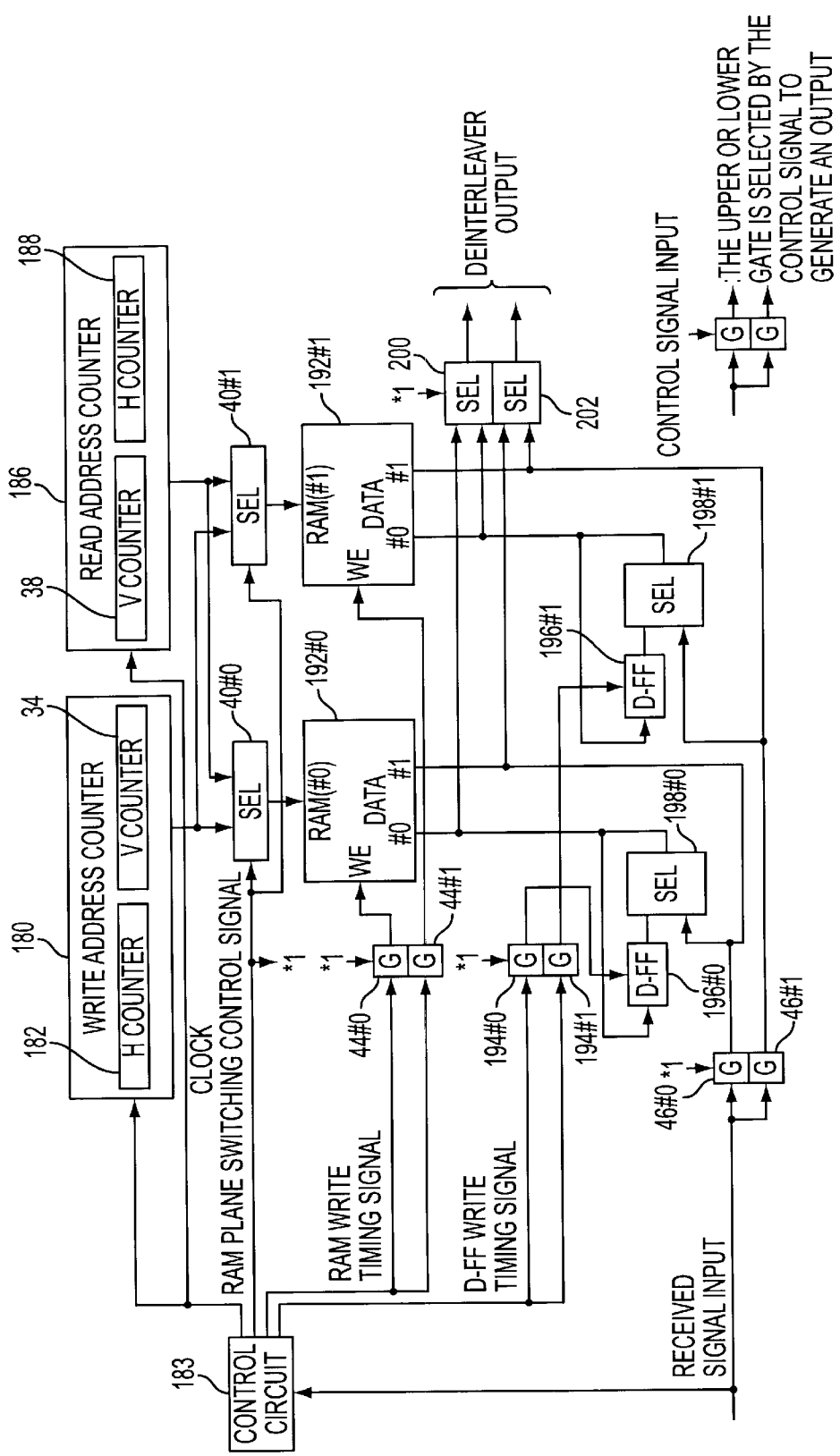
FIG. 13 is a diagram showing the configuration of a bit deinterleave circuit implemented by the third embodiment of the present invention.

FIG. 13 is a diagram showing the configuration of a bit deinterleave circuit implemented by the third embodiment of the present invention. Components of the third embodiment substantially identical with those shown in FIG. 23 are denoted by the same reference numerals as the latter. The bit deinterleave circuit implemented by the third embodiment is different from the conventional bit deinterleave circuit in that:

(1) The data widths of RAMs 192#0 and 192#1 are each set at k bits.

(2) A horizontal-direction counter 182 employed in a write address counter 180 and a horizontal-direction counter 188 employed in a read address counter 186 count from 0 to (n1−1) where n1=(n/k).

(3) {n×(k−1)+1} D-FFs 196#0 and D-FFs 196#1 connected in cascade, a selector (SEL) 198#0 and a selector (SEL) 198#1 are provided so that a k-bit parallel received signal is written into the RAM 192#0 or 192#1. The output of the selector 198#0 is supplied also to a D-FF at the first stage of the D-FFs 196#0. By the same token, the output of the selector 198#1 is supplied also to a D-FF at the first stage of the D-FFs 196#1.

(4) A total of k selectors are provided. For k=2, the selectors are selectors 200 and 202 in this embodiment.

Figure 14:
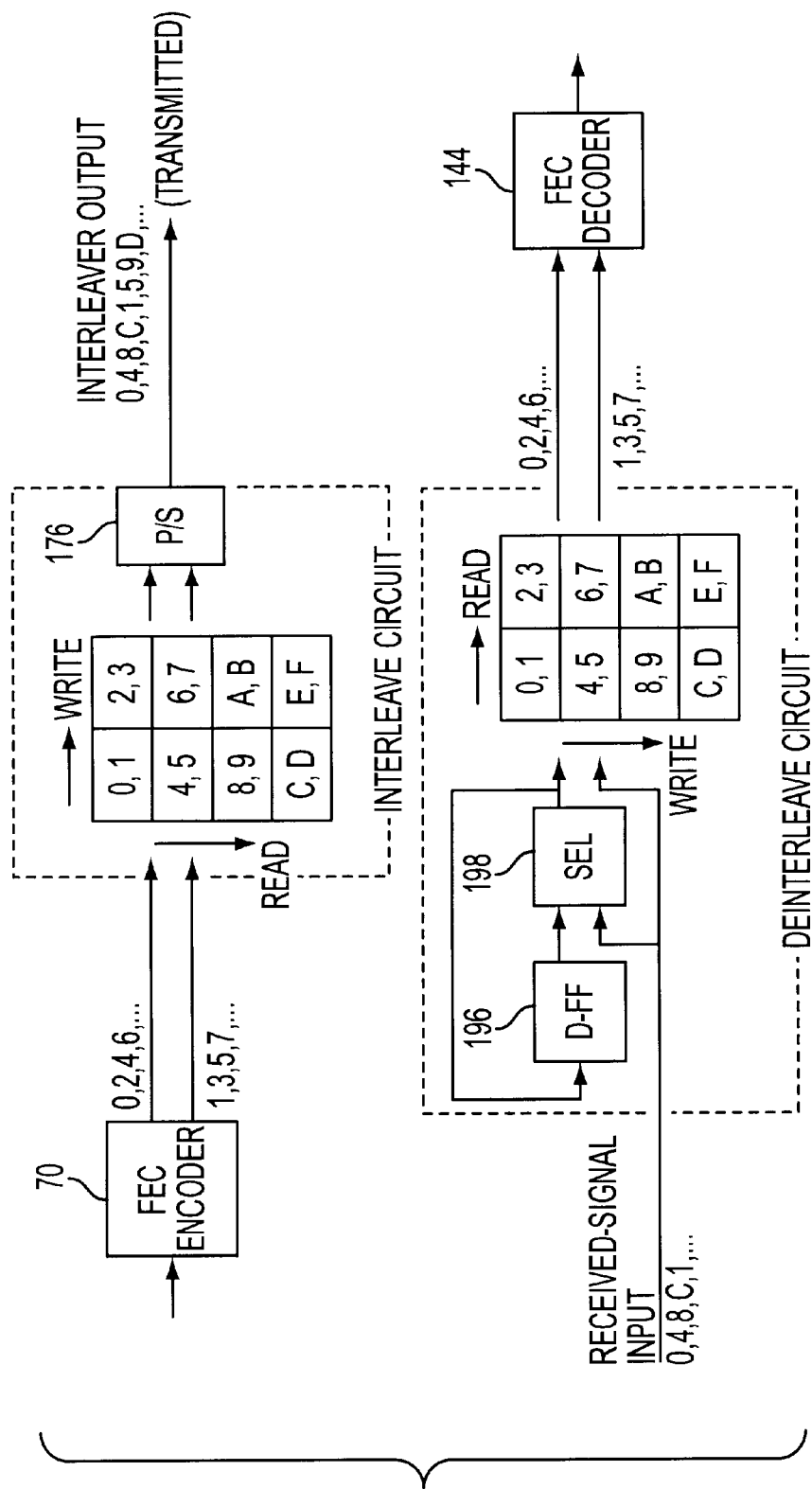
FIG. 14 is an explanatory diagram used for describing the operations of the bit interleave circuit and the bit deinterleave circuit shown in FIGS. 12 and 13, respectively.

FIG. 14 is an explanatory diagram used for describing the operations of the bit interleave circuit and the bit deinterleave circuit shown in FIGS. 12 and 13, respectively. The operations of the bit interleave circuit and the bit deinterleave circuit shown in FIGS. 12 and 13, respectively are described as follows.

(a) Operation of the Bit Interleave Circuit Shown in FIG. 12

Figure 15:
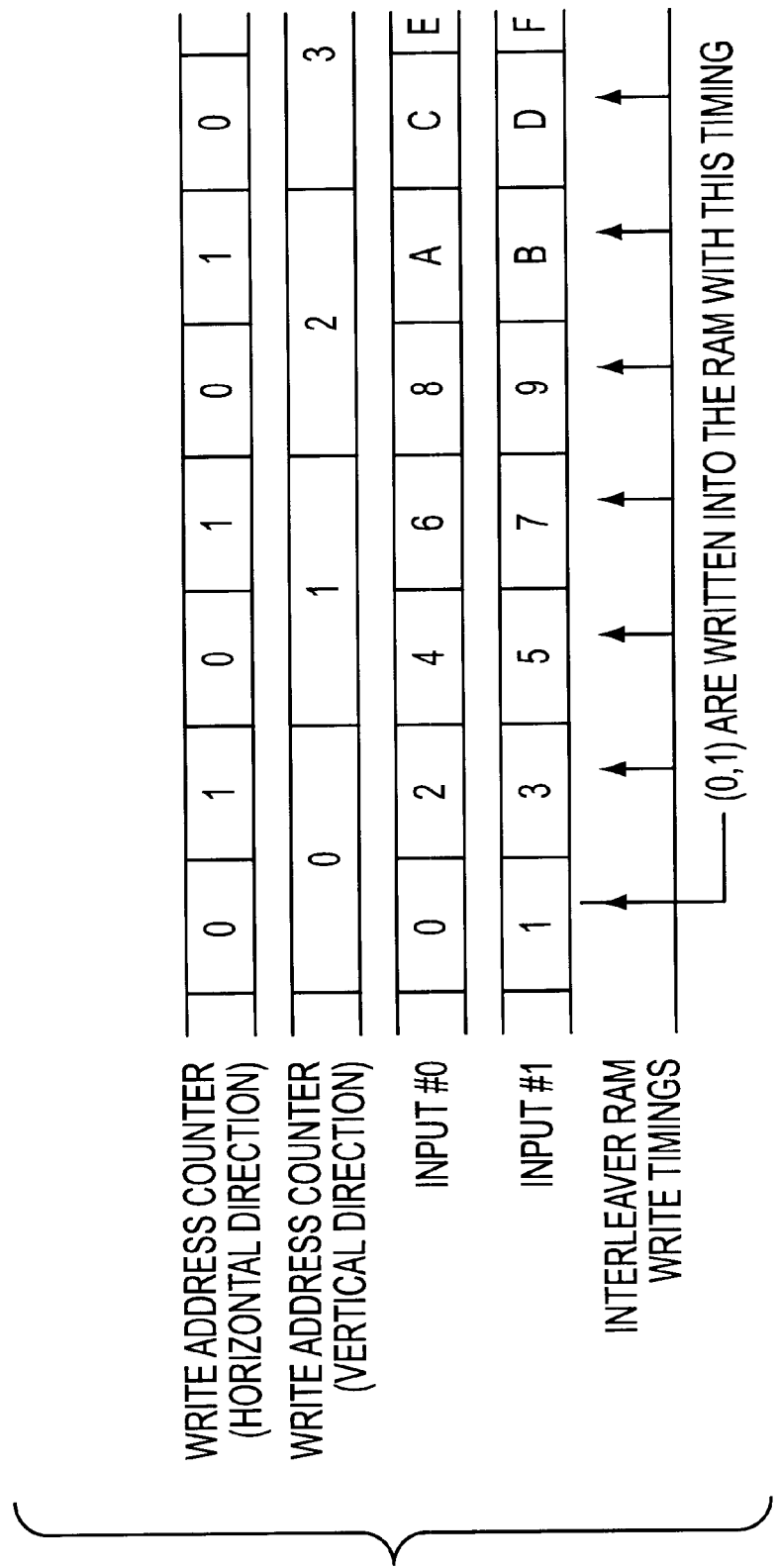
FIG. 15 shows write time charts of the bit interleave circuit shown in FIG. 12.

FIG. 15 shows write time charts of the bit interleave circuit shown in FIG. 12. The horizontal-direction counter 152 employed in the write address counter 150: repeatedly counts the number of clocks in a signal output by a control circuit 151 from 0 to (n1−1) where n1=(n/k), outputting the clock count to the address terminal of the RAM 166#0 or 166#1 by way of the selectors 14#0 or 14#1, respectively as a lower-order address. On the other hand, a vertical-direction counter 4 also employed in the write-address counter 150 repeatedly counts the number of clock periods repeatedly from 0 to (m−1), outputting the clock-period count to the address terminal of the RAM 16#0 or the RAM 16#1 by way of the selector 14#0 or 14#1, respectively as an upper-order address. By a clock period, the counting period of the horizontal-direction counter 152 is meant.

A RAM write timing signal generated by the control circuit 151 is made valid by a clock signal synchronized with an encoded list. The k-bit parallel encoded list output by an FEC encoding circuit 70 are written into the memory area of the RAM 166#0 or 166#1 selected by the RAM plane switching control signal in interleave-block units by way of gate circuits 168#0, 168#1, 170#0 and 170#1 and data terminals #0 and #1 of the RAM 166#0 or 166#1. For k=2, 2 bits (0, 1), 2 bits (2, 3), 2 bits (4, 5) and so on are written into the RAM 166#0 or 166#1 by each two bits at (a horizontal-direction address of 0 and a vertical-direction address of 0), (a horizontal-direction address of 1 and a vertical-direction address of 0) and (a horizontal-direction address of 0 and a vertical-direction address of 1), respectively as shown in FIG. 14. In order to accomplish such write operations, the horizontal-direction counter 152 operates at a clock period equal to a half of the clock period of the conventional counter 6.

Figure 16:
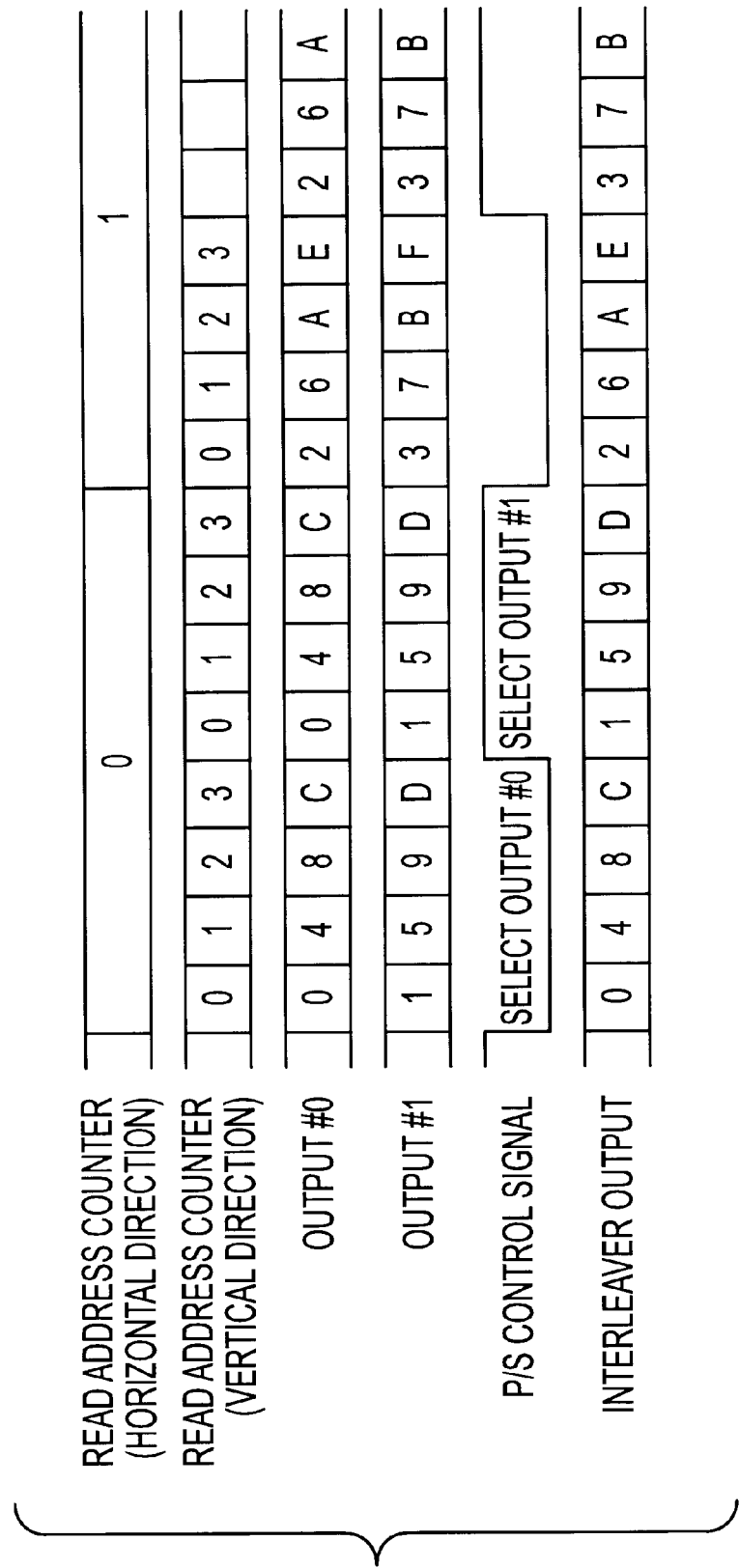
FIG. 16 shows read time charts of the bit interleave circuit shown in FIG. 12.

FIG. 16 shows read time charts of the bit interleave circuit shown in FIG. 12. As shown in FIG. 16, a vertical-direction counter 10 employed in the read address counter 160 repeatedly counts the number of clock periods, which are each equal to 1/k times the clock period generated by the control circuit 151 in synchronization with the encoded list, from 0 to (m−1) and outputs the clock-period count to the address terminal of the RAM 166#0 or 166#1 by way of the selector 14#0 or 14#1, respectively as an upper-order address. On the other hand, the horizontal-direction counter 162 also employed in the read address counter 160 repeatedly counts the number of clock periods, which are each equal to k times the counting period of the vertical-direction counter 10, from 0 to (n1−1) and outputs the clock-period count to the address terminal of the RAM 166#0 or 166#1 by way of the selector 14#0 or 14#1, respectively as a lower-order address.

Each interleave block is read out alternately from the RAM 166#0 or 166#1 through the data terminals #0 and #1 to be output as an interleaved k-bit encoded list. FIG. 16 shows timing charts for n=m=4 and k=2. For a horizontal-direction address of 0, the counting to generate vertical-direction addresses 0 to 3 is carried out twice. A sequence of 2 bits (0, 1), 2 bits (4, 5), 2 bits (8, 9) and 2 bits (C, D) are read out at the same time from the vertical addresses 0, 1, 2 and 3, respectively. Thus, for a horizontal-direction address of 0, such a sequence is output twice. A P/S converter 176 sequentially selects data received from one of outputs #i of the k data terminals of the RAM 166#0 or 166#1 by way of selectors 172 and 174 in accordance with a P/S control signal generated by the control circuit 151 in synchronization with the counting periods of the read address counter 160. In the case of k=2, for example, the output #0 is selected before selection of the output #1.

As a result, the bit interleave circuit outputs a list of (0, 4, 8, C, 1, 5, 9, D, 6, A, E, 3, 7, B) much like the conventional circuit. In the case of the bit interleave circuit implemented by this embodiment, however, the clock period of the horizontal-direction counter 152 employed in the bit interleave circuit is only a half of that of the conventional circuit, resulting in improvements such as reduction of the power consumption. In the case of a circuit employing a device with a power consumption proportional to the operating speed such as a CMOS-IC, the power consumption can be reduced by having the circuit operate slower. Since about 50% of all circuits employed in the bit interleave circuit operate at half of the speed of the conventional circuit, the power consumption of the bit interleave circuit can be reduced by 25% from that of the conventional circuit. The encoded list output by the P/S converter 176 is modulated by a modulator adopting the BPSK or QPSK method. It should be noted that, if the modulator adopts the QPSK modulation used widely in satellite and mobile communications, the parallel-to-serial conversion is not necessary for k=2. A signal output by the modulator is subjected to a frequency transformation process in an RF unit before being transmitted from an antenna.

(b) Operation of the Bit Deinterleave Circuit Shown in FIG. 13

Figure 17:
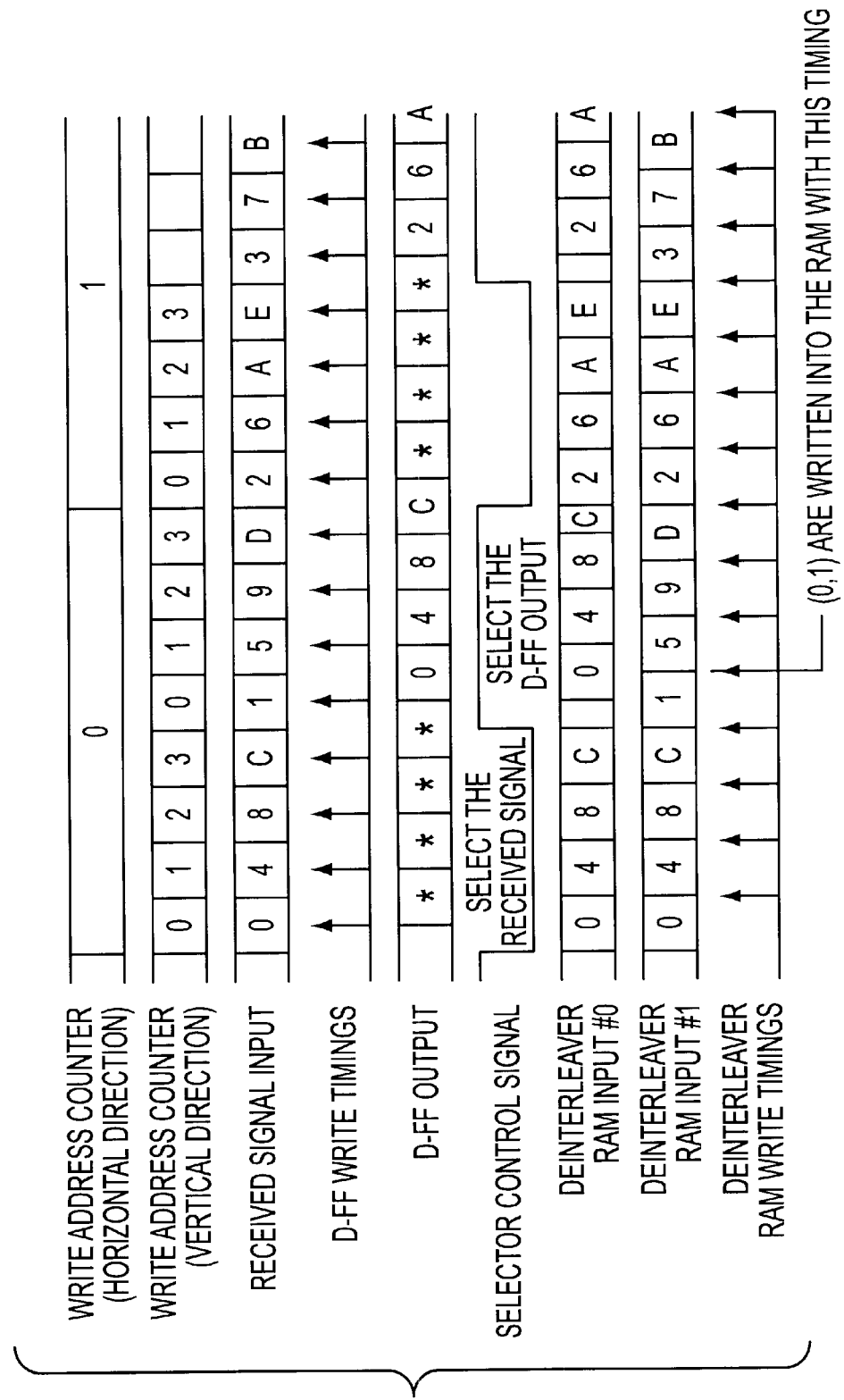
FIG. 17 shows write time charts of the bit deinterleave circuit shown in FIG. 13.

FIG. 17 shows write time charts of the bit deinterleave circuit shown in FIG. 13. As shown in FIG. 17, a vertical-direction counter 34 employed in a write address counter 180 repeatedly counts the number of clocks output by a control circuit 183 in synchronization with input events of a received signal from 0 to (m−1) and outputs the clock count to the address terminal of a RAM 192#0 or 192#1 by way of a selector 40#0 or 40#1, respectively as an upper-order address. On the other hand, a horizontal-direction counter 182 also employed in the read address counter 180 repeatedly counts the number of clock periods, which are each equal to k times the counting period of the vertical-direction address counter 34, from 0 to (n1−1) where n1=n/k and outputs the clock-period count to the address terminal either of the RAM 192#0 or 192#1 by way of the selector 40#0 or 40#1, respectively.

A RAM write timing signal generated by the control circuit 183 is made valid by a clock signal synchronized with input of a received signal. Each input interleave block is supplied to the RAM 192#0 or 192#1 selected alternately by way of a gate circuit 44#0 or 44#1, respectively. A D-FF write timing signal generated by the control circuit 183 is made valid by a clock signal synchronized with input of a received signal, being supplied to a clock terminal of a D-FF 196#0 or 196#1 by way of a gate circuit 194#0 or 194#1, respectively. On the other hand, the received signal is supplied to a selector 198#0 and the data terminal #1 of the RAM 192#0 by way of a gate circuit 46#0 or a selector 198#1 and the data terminal #1 of the RAM 192#1 by way of a gate circuit 46#1. In accordance with a SEL control signal generated by the control circuit 183 and in synchronization with counting periods of the vertical-direction counter 34, the selectors 198#0 and 198#1 select received signals during (k−1)counting periods of the vertical-direction counter 34 and select outputs of the D-FFs 196#0 and 196#1, respectively during the last counting period of the vertical-direction counter 34, outputting the selected outputs to the (k−2) data terminals of either the RAM 192#0 or 192#1, respectively.

It should be noted that, for k >2, pieces of data from the outputs terminals of (k−2) D-FFs are supplied to the data terminals of the RAM 192#0 or the RAM 192#1. The (k−2) D-FFS are selected among the ((k−1)×m+1) D-FFs connected to each other in cascade, starting with the DFF at the last stage at intervals of m D-FFs. In the case of n=4, m=4 and k=2, for example, received signals 0, 4, 8 and C are once latched in the D-FF 196#0 or 196#1 before being supplied to the data terminal #0 of the RAM 192#0 or 192#1 from the D-FF at the last stage by way of the selector 198#0 or 198#1, respectively after four clocks have lapsed since the latching of the received signals to be written into the RAM 192#0 or 192#1 as shown in FIG. 17. At the same time, received signals (1, 5, 9 and D) are sequentially supplied to the data terminal of the RAM 192#0 or 192#1 to be written therein. By carrying out the above operations repeatedly, in the case of n=4, m=4 and k=2, for example, at a horizontal-direction address of 0, received signals (0, 1), (4,5), (8, 9), (C, D) are written into vertical-direction addresses of 0, 1, 2 and 3, respectively whereas, at a horizontal-direction address of 1, on the other hand, received signals (2, 3), (6, 7), (A, B) and (E, F) are written into vertical-direction addresses of 0, 1, 2 and 3, respectively.

Figure 18:
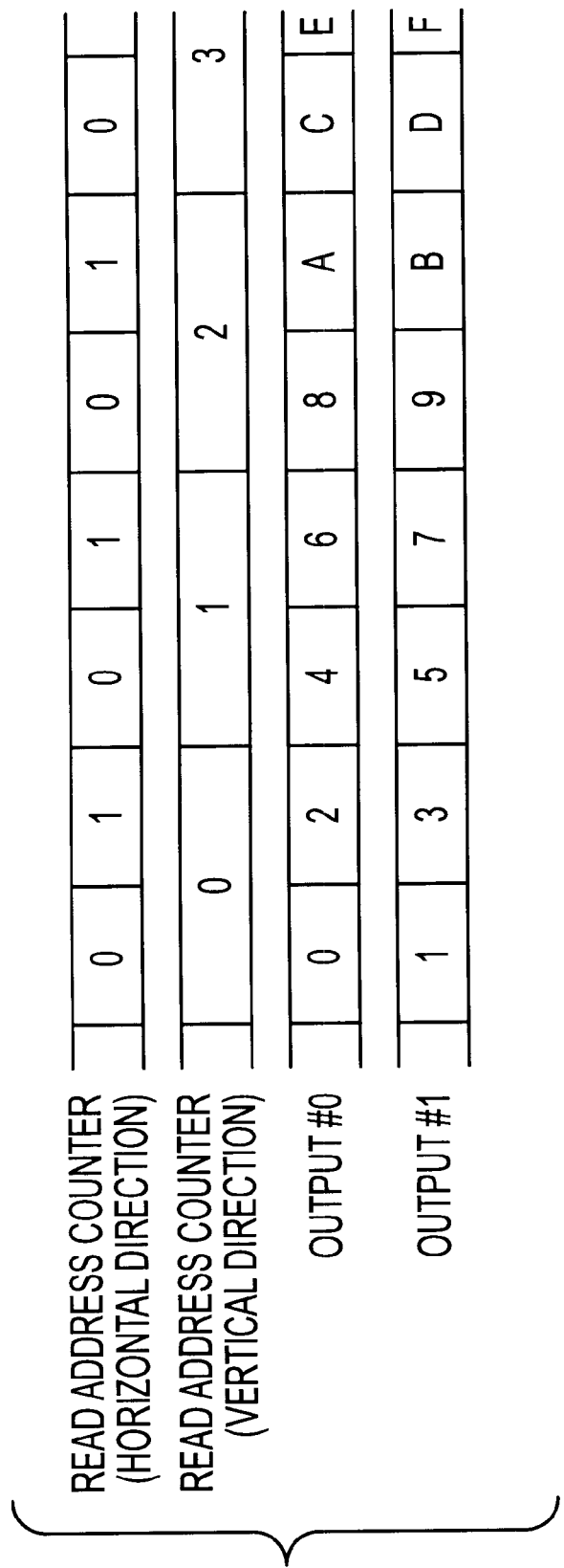
FIG. 18 shows read time charts of the bit deinterleave circuit shown in FIG. 13.

FIG. 18 shows write time charts of the bit deinterleave circuit shown in FIG. 13. As shown in FIG. 18, a horizontal-direction counter 188 employed in a read address counter 186 repeatedly counts the number of clock periods, which are each equal to k times the input period of a received signal, from 0 to (n1−1) and outputs the clock-period count to the address terminal of the RAM 192#0 or 192#1 by way of a selector 40#0 or 40#1, respectively as a lower-order address. On the other hand, a vertical-direction counter 38 also employed in the read address counter 186 repeatedly counts the number of clock periods from 0 to (m−1) and outputs the clock-period count to the address terminal of the RAM 192#0 or 192#1 by way of the selector 40#0 or 40#1, respectively as an upper-order address. By a clock period, the counting period of the horizontal-direction counter 188 is meant.

k bits are output in parallel from k data terminals either of the RAM 192#0 or 192#1 as a result of a bit deinterleave process to an FEC decoder 144 by way of selectors 200 and 202. In the case of k=2, for example, the result of the bit deinterleave process is a series of two parallel bits (0, 1), (2, 3), (4, 5), (6, 7) and so on. The FEC decoder 144 receives k parallel bits as an output of the bit deinterleave process, decoding the bits by adopting typically the viterbi decoding technique. In this way, the horizontal-direction counter 188 of the read address counter 186 employed in the bit deinterleave circuit can be operated and the read operations of the RAMs 192#0 and 192#1 can be carried out at a clock period equal to k times the clock period of the received signal, so that the power consumption can be reduced.

Fourth Embodiment

Figure 19:
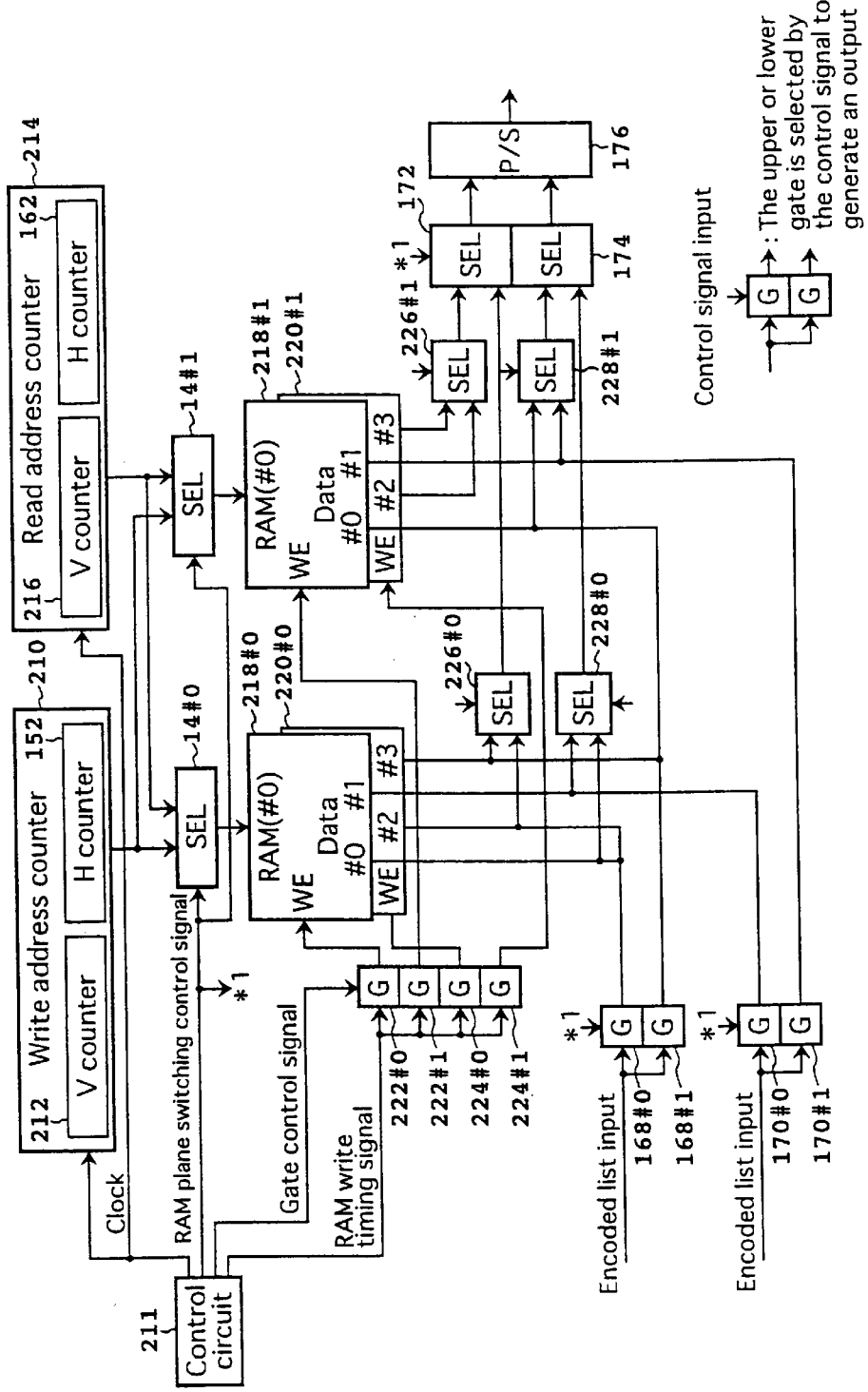
FIG. 19 is a diagram showing the configuration of a bit interleave circuit implemented by a fourth embodiment of the present invention.

FIG. 19 is a diagram showing the configuration of the bit interleave circuit implemented by a fourth embodiment. Components of the fourth embodiment substantially identical with those of the bit interleave circuit shown in FIG. 12 are denoted by the same reference numerals as the latter. The bit interleave circuit shown in FIG. 19 is different from the bit interleave circuit shown in FIG. 12 in that, in the case of the former:

(1) There are provided k RAM pairs where k is the number of input bits in a parallel encoded list. In a typical example shown in FIG. 19, k is 2 or there are 2 RAM pairs. The first RAM pair comprises RAMs 218#0 and 218#1 each serving as plane 0 whereas the second RAM pair comprises RAMs 220#0 and 220#1 each serving as plane 1.

(2) When one interleave block expressed in the form of a matrix of n×m bits is stored in the k RAM pairs, that is, a pair of RAM 0-planes and a pair of RAM 1-planes for k=2 as described above, the block is written into the RAMs 218#0 and 220#0 or the RAMs 218#1 and 220#1. To put it in detail, an encoded list on the i-th row of the matrix and an encoded list on the (i+1)th row of the matrix are written into different RAMs 218#j and 220#j at the same address where j is 0 or 1.

(3) A vertical-direction counter 212 employed in a write address counter 210 and a vertical-direction counter 216 employed in the read address counter 214 each count from 0 to {(m/k)−1}.

(4) A total of 2×k gate circuits 222 and 224 are provided. For k=2, the gate circuits 222 and 224 are gate circuits 222#0, 222#1, 224#0 and 224#1.

(5) Encoded lists are supplied to gate circuits 168#0, 168#1, 170#0 and 170#1. Signals output by the gate circuits 168#0, 168#1, 170#0 and 170#1 are supplied to predetermined data terminals of k RAMs 218#0 and 220#0. For k=2, for example, the output of the gate circuit 168#0 is supplied to the data terminal #0 of the RAM 218#0 and the data terminal #2 of the RAM 220#0.

(6) A total of 2×k selectors 226 and 228 are provided. For k=2, the selectors 226 and 228 are selectors 226#0, 226#1, 228#0 and 228#1. The selector 226#0 is used for selecting encoded lists output from the data terminals of the RAM 220#0. The selector 226#1 is used for selecting encoded lists output from the data terminals of the RAM 220#1. The selector 228#0 is used for selecting encoded lists output from the data terminals of the RAM 218#0. The selector 228#1 is used for selecting encoded lists output from the data terminals of the RAM 218#1.

Figure 20:
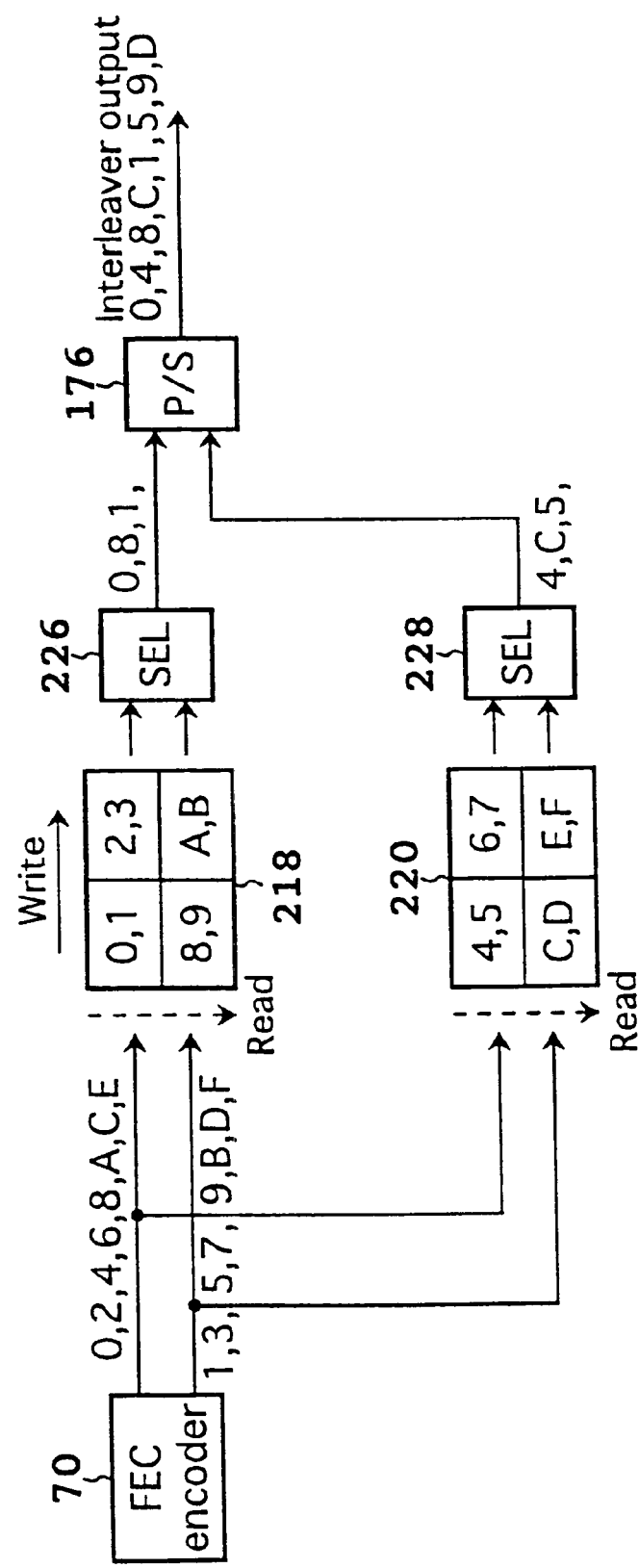
FIG. 20 is an explanatory diagram used for explaining the write operation of the bit interleave circuit shown in FIG. 19.

FIG. 20 is an explanatory diagram used for explaining the operation of the bit interleave circuit shown in FIG. 19. The operation of the bit interleave circuit shown in FIG. 19 is explained as follows.

(a) Write Operation

A horizontal-direction counter 152 employed in a write address counter 210 repeatedly counts the number of clocks output by a control circuit in synchronization with an encoded list from 0 to (n1−1) where n1=n/k and outputs the clock count to the address terminals of the RAMs 218#0 and 220#0 or the RAMs 218#1 and 220#1 by way of the selector 14#0 or 14#1, respectively as a lower-order address. On the other hand, a vertical-direction counter 212 also employed in the write address counter 210 repeatedly counts the number of clock periods from 0 to (m1−1) where m1=m/k and outputs the clock-period count to the address terminals of the RAMs 218#0 and 220#0 or the RAMs 218#1 and 220#1 by way of the selector 14#0 or 14#1, respectively as an upper-order address. By a clock period, k times the counting period of the horizontal-direction counter 152 is meant.

Either the gate circuits 222#0 and 224#0 output RAM write timing signals to the WE terminals of the RAMs 218#0 and 220# 0, respectively, or the gate circuits 222#1 and 224#1 output RAM write timing signals to the WE terminals of the RAMs 218#1 and 220#1, respectively. It should be noted that, for each interleave block, a RAM write timing signal is supplied to either the gate circuit 222#0 for the RAM 218#0 serving as a 0-plane, the gate circuit 224#0 for the RAM 220#0 serving as a 0-plane, the gate circuit 222#1 for the RAM 218#1 serving as a 1-plane or the gate circuit 22 4#1 for the RAM 2 20#1 serving as a 1-plane. One of the gate circuits 220#0 and 224#0 is selected alternately by a gate control signal. By the same token, one of the gate circuits 220#1 and 224#1 is selected alternately by the gate control signal.

In addition, the write operation is alternately switched between the RAM 218#0 serving as a 0-plane and the RAM 220#0 serving as a 0-plane for two encoded list segments on two consecutive horizontal-direction rows in the interleave-block matrix by the gate control signal. By the same token, the write operation is alternately switched between the RAM 218#1 serving as a 1-plane and the RAM 220#1 serving as a 1-plane for two encoded list segments on two consecutive horizontal-direction rows in the interleave-block matrix by the gate control signal. A parallel encoded list is thus written into an area specified by an address in the RAM 218#0, 220#0, 218#1 or 220#1. When a row of k×n bits of an interleave-block matrix is written into a 0 or 1-plane of a specific RAM, the next row is written into the other plane, a 0 or 1-plane of the RAM. For example, assume that k=2 and n=4. In this case, a row of (0, 1) and (2, 3) is written into the RAM 218#0 or 218#1 whereas the next row of (4, 5) and (6, 7) is written into the RAM 220#0 or 220#1 as shown in FIG. 20. Then, a row of (8, 9) and (A, B) is written into the RAM 218#0 or 218#1 whereas the next row of (C, D) and (E, F) is written into the RAM 220#0 or 220#1.

(b) Read Operation

FIG. 21 is an explanatory diagram used for explaining the read operation of the bit interleave circuit shown in FIG. 19. The control circuit 211 outputs selector control signals to selectors 226#0 and 228#0 or 226#1 and 228#1 so as to sequentially select signals output by data terminals associated with either pair of selectors from a column on the left end to a column on the right end. As shown in FIG. 19, a vertical-direction counter 216 employed in a read address counter 214 repeatedly counts the number of clocks output by the control circuit 211 from 0 to (m1−1) and outputs the clock count to the address terminals of RAMs 218#0 and 220#0 or 218#1 and 220#1 by way of a selector 14#0 or 14#1, respectively as an upper-order address.

On the other hand, a horizontal-direction counter 162 also employed in the read address counter 214 repeatedly counts the number of clock periods from 0 to (n1−1) and outputs the clock-period count to the address terminals of the RAMs 218#0 and 220#0 or 218#1 and 220#1 by way of the selector 14#0 or 14#1, respectively as a lower-order address. By a clock period, k times the counting period of the vertical-direction counter 216 is meant. Encoded lists are read out from k data terminals of the RAMs 218#0 and 220#0 or 218#1 and 220#1. The control circuit 211 outputs selector control signals to selectors 226#0 and 228#0 or 226#1 and 228#1 so as to sequentially select signals output by data terminals associated with either pair of selectors from a column on the left end to a column on the right end in synchronization with a count period of the vertical-direction counter 216. The selected signals are output to a P/S converter 176 by way of selectors 172 and 174.

For example, at a horizontal address of 0, the vertical addresses are 0, 1, 0 and 1. At the first vertical addresses 0 and 1, outputs #0 and #2 are selected to output list segments (0, 4) and (8, C) sequentially as shown in FIG. 21. At the second vertical addresses 0 and 1, outputs #1 and #3 are selected to output list segments (1, 5) and (9, D) sequentially. The P/S converter 176 converts the parallel interleaver output into serial data. According to the fourth embodiment described above, since the clock period of the vertical-direction counter 216 employed in the read address counter 214 is longer than that of the bit interleave circuit implemented by the third embodiment, the power consumption can be further reduced. It should be noted that a combination of the bit interleave circuits provided by the first, second and third embodiments can of course be implemented.

According to the present invention, if the reception level of a bit of a received signal completing an interleave process is lower than a threshold value, a command signal requesting that computation be inhibited is issued for the bit. As a result, the BER characteristic can be prevented from deteriorating. In addition, since the distance between the last bit of an interleave block and the first bit of the immediately succeeding interleave block can be set at least at 2, a burst error can be randomized. As a result, an error correction capability can be enhanced. Furthermore, since the operating-clock frequency can be reduced, the power consumption decreases.

It should be noted that the present invention is not limited to the details of the preferred embodiments described above to the bitter end. Rather, the scope of the present invention is defined by appended claims, and all changes as well as modifications falling within the equivalence of the scope of the claims are therefore to be embraced by the present invention.

What is claimed is:

1. A bit deinterleave circuit bit deinterleaving a signal, said bit deinterleave circuit comprising:
   measurement means for measuring the reception level of each bit in a received signal completing a bit interleave process;
   command-signal generating means for outputting a command signal to indicate whether computation in error correction is to be inhibited or permitted for said bit on the basis of said reception level of each bit measured by said measurement means and a threshold value;
   first deinterleave means for deinterleaving said received signal completing a bit interleave process; and
   second deinterleave means for rearranging said command signals so as to output command signals according to a signal output by said first deinterleave means.

2. A bit interleave circuit bit interleaving a signal, said bit interleave circuit comprising:
   a random-access memory allowing operations based on an address signal to write and read data;
   first counter for carrying out a counting operation synchronized with an input encoded list and outputting a lower-order address of said address signal;
   second counter for carrying out a counting operation synchronized with counting periods of said first counter and outputting an upper-order address of said address signal;
   third counter for carrying out a counting operation synchronized with said input encoded list and outputting an upper-order address of said address signal;
   fourth counter for carrying out a counting operation synchronized with counting periods of said third counter and outputting a lower-order address of said address signal; and
   inverter circuit for inverting the most significant bit of either said second counter or said third counter.

3. A bit deinterleave circuit bit deinterleaving a signal, said bit deinterleave circuit comprising:
   a random-access memory allowing operations based on an address signal to write and read out data;
   first counter for carrying out a counting operation synchronized with a received signal completing a bit interleave process and outputting an upper-order address of said address signal;
   second counter for carrying out a counting operation synchronized with counting periods of said first counter and outputting a lower-order address of said address signal;
   third counter for carrying out a counting operation synchronized with said received signal completing a bit interleave process and outputting a lower-order address of said address signal;
   fourth counter for carrying out a counting operation synchronized with counting periods of said third counter and outputting an upper-order address of said address signal; and
   inverter circuit for inverting the most significant bit of either said first counter or said fourth counter.

4. A bit interleave circuit bit interleaving a signal, said bit interleave circuit comprising:
   a random-access memory allowing operations based on an address signal to write and read k bits at the same time where $k \geq 2$;
   first counter for carrying out a counting operation synchronized with a k-bit parallel encoded list and outputting a lower-order address of said address signal;
   second counter for carrying out a counting operation synchronized with counting periods of said first counter and outputting an upper-order address of said address signal;
   third counter for carrying out a counting operation synchronized with clock periods each equal to 1/k times an input period of said encoded list and outputting an upper-order address of said address signal;
   fourth counter for carrying out a counting operation synchronized with clock periods each equal to k times the counting period of said third counter and outputting a lower-order address of said address signal; and
   selector for selecting a bit from a k-bit encoded list read from said random-access memory.

5. A bit deinterleave circuit bit deinterleaving a signal, said bit deinterleave circuit comprising:
   a random-access memory allowing operations based on an address signal to write and read k bits at the same time where k>=2;
   first counter for carrying out a counting operation synchronized with a received signal completing a bit interleave process and outputting an upper-order address of said address signal;
   second counter for carrying out a counting operation synchronized with counting periods of said first counter and outputting a lower-order address of said address signal;

a plurality of flip-flops to flip-flop at least as many as (k−1) times a number different possible values of said upper-order address, with said plurality of flip-flops being used for receiving said received signal;

third counter for carrying out a counting operation synchronized with clock periods each equal to k times an input period of said received signal and outputting a lower-order address of said address signal; and fourth counter for carrying out a counting operation synchronized with counting periods of said third counter and outputting a lower-order address of said address signal.

6. A bit interleave circuit bit interleaving a signal, said bit interleave circuit comprising:

k random-access memories allowing operations based on an address signal to write and read k bits at the same time where k≧2;

first counter for carrying out a counting operation synchronized with a k-bit parallel encoded list and outputting a lower-order address of said address signal;

second counter for carrying out a counting operation synchronized with clock periods each equal to k times the counting period of said first counter and outputting an upper-order address of said address signal;

write control circuit for generating a write enable signal to one of said k random-access memories;

third counter for carrying out a counting operation synchronized with clock periods each equal to k times an input period of said encoded list and outputting an upper-order address of said address signal;

fourth counter for carrying out a counting operation synchronized with clock periods each equal to k times the counting period of said third counter and outputting a lower-order address of said address signal; and selector as many as k for selecting a bit from a k-bit data signal read from said random-access memories.

* * * * *